(12) United States Patent
Kovsh et al.

(10) Patent No.: US 7,561,607 B2
(45) Date of Patent: Jul. 14, 2009

(54) LASER SOURCE WITH BROADBAND SPECTRUM EMISSION

(75) Inventors: Alexey Kovsh, Dortmund (DE); Alexey Zhukov, St. Petersburg (RU); Daniil Livshits, Dortmund (DE); Igor Krestnikov, Dortmund (DE)

(73) Assignee: Innolume GmbH, Dortmund (DE)

( * ) Notice: Subject to any disclaimer, the term of this patent is extended or adjusted under 35 U.S.C. 154(b) by 12 days.

(21) Appl. No.: 11/295,943

(22) Filed: Dec. 7, 2005

(65) Prior Publication Data

US 2007/0127531 A1    Jun. 7, 2007

(51) Int. Cl.
*H01S 3/04* (2006.01)

(52) U.S. Cl. ............ 372/43.01; 372/44.01; 372/45.01

(58) Field of Classification Search .......... 372/43.01, 372/44.01, 45.01
See application file for complete search history.

(56) References Cited

U.S. PATENT DOCUMENTS

| | | | |
|---|---|---|---|
| 4,100,562 A | 7/1978 | Sugawara | 257/82 |
| 4,368,481 A | 1/1983 | Ohashi et al. | 257/116 |
| 4,438,447 A | 3/1984 | Copeland, III et al. | 257/82 |
| 4,720,468 A | 1/1988 | Menigaux et al. | 438/31 |
| 4,734,910 A | 3/1988 | Izadpanah | 372/18 |
| 4,759,023 A | 7/1988 | Yamaguchi | 438/23 |
| 4,839,884 A | 6/1989 | Schloss | 398/87 |
| 4,918,497 A | 4/1990 | Edmond | 257/77 |
| 4,959,540 A | 9/1990 | Fan et al. | 250/227.12 |
| 4,980,568 A | 12/1990 | Merrick et al. | 250/551 |
| 5,190,883 A | 3/1993 | Menigaux et al. | 438/69 |
| 5,193,131 A | 3/1993 | Bruno | 385/15 |
| 5,208,822 A | 5/1993 | Haus et al. | 372/50.1 |
| 5,214,664 A | 5/1993 | Paoli | 372/50.121 |
| 5,274,649 A | 12/1993 | Hirayama et al. | 372/20 |
| 5,291,010 A | 3/1994 | Tsuji | 250/208.1 |
| 5,298,787 A | 3/1994 | Bozler et al. | 257/592 |
| 5,321,786 A | 6/1994 | Valette et al. | 385/92 |
| 5,345,557 A | 9/1994 | Wendt | 710/100 |
| 5,357,122 A | 10/1994 | Okubora et al. | 257/84 |
| 5,382,810 A | 1/1995 | Isaksson | 257/81 |
| 5,463,229 A | 10/1995 | Takase et al. | 257/59 |

(Continued)

FOREIGN PATENT DOCUMENTS

EP       1341333 A2    3/2003

OTHER PUBLICATIONS

L. F. Lester et al., "Optical Characteristics of 1.24-μm InAs Quantum-Dot Laser Diodes," IEEE Photonic Tech. Let, vol. 11, No. 8, pp. 931-933, 1999.*

(Continued)

*Primary Examiner*—Minsun Harvey
*Assistant Examiner*—Xnning Niu
(74) *Attorney, Agent, or Firm*—Brown & Michaels, PC

(57) ABSTRACT

A quantum dot laser operates on a quantum dot ground-state optical transition. The laser has a broadband (preferably≧15 nm) spectrum of emission and a high output power (preferably≧100 mW). Special measures control the maximum useful pump level, the total number of quantum dots in the laser active region, the carrier relaxation to the quantum dot ground states, and the carrier excitation from the quantum dot ground states. In one embodiment, a spectrally-selective loss is introduced into the laser resonator in order to suppress lasing on a quantum dot excited-state optical transition, thereby increasing the bandwidth of the emission spectrum.

39 Claims, 14 Drawing Sheets

U.S. PATENT DOCUMENTS

| | | | |
|---|---|---|---|
| 5,523,557 A | 6/1996 | Bruno | 250/214.1 |
| 5,536,974 A | 7/1996 | Nishiguchi | 257/778 |
| 5,539,763 A | 7/1996 | Takemi et al. | 372/50.1 |
| 5,548,433 A | 8/1996 | Smith | 398/155 |
| 5,568,499 A * | 10/1996 | Lear | 372/45.01 |
| 5,569,934 A | 10/1996 | Fujii et al. | 257/21 |
| 5,604,361 A | 2/1997 | Isaksson | 257/99 |
| 5,608,231 A | 3/1997 | Ugajin et al. | 257/24 |
| 5,633,527 A | 5/1997 | Lear | 257/432 |
| 5,663,592 A | 9/1997 | Miyazawa et al. | 257/627 |
| 5,673,284 A * | 9/1997 | Congdon et al. | 372/50.1 |
| 5,705,831 A | 1/1998 | Uemura et al. | 257/78 |
| 5,710,436 A | 1/1998 | Tanamoto et al. | 257/14 |
| 5,728,605 A | 3/1998 | Mizutani | 438/41 |
| 5,767,508 A | 6/1998 | Masui et al. | 250/227.11 |
| 5,801,872 A | 9/1998 | Tsuji | 359/248 |
| 5,802,084 A | 9/1998 | Bowers et al. | 372/18 |
| 5,812,574 A | 9/1998 | Takeuchi et al. | 372/45.01 |
| 5,812,708 A | 9/1998 | Rao | 385/14 |
| 5,825,051 A | 10/1998 | Bauer et al. | 357/82 |
| 5,828,679 A | 10/1998 | Fisher | 372/6 |
| 5,854,804 A | 12/1998 | Winer et al. | 372/38.1 |
| 5,889,903 A | 3/1999 | Rao | 385/14 |
| 5,940,424 A * | 8/1999 | Dietrich et al. | 372/49.01 |
| 5,945,720 A | 8/1999 | Itatani et al. | 257/432 |
| 5,946,438 A | 8/1999 | Minot et al. | 385/88 |
| 6,011,296 A | 1/2000 | Hassard et al. | 257/448 |
| 6,031,243 A | 2/2000 | Taylor | 257/13 |
| 6,031,859 A | 2/2000 | Nambu | 372/50 |
| 6,043,515 A | 3/2000 | Kamiguchi et al. | 257/103 |
| 6,052,400 A | 4/2000 | Nanbu et al. | 372/50.1 |
| 6,066,860 A | 5/2000 | Katayama et al. | 257/71 |
| 6,093,939 A | 7/2000 | Artigue et al. | 257/99 |
| 6,232,142 B1 | 5/2001 | Yasukawa | 438/69 |
| 6,245,259 B1 | 6/2001 | Hohn et al. | 252/301.36 |
| 6,288,410 B1 | 9/2001 | Miyazawa | 257/14 |
| 6,310,372 B1 | 10/2001 | Katayama et al. | 257/291 |
| 6,318,901 B1 | 11/2001 | Heremans et al. | 385/53 |
| 6,320,204 B1 | 11/2001 | Hirabayashi et al. | 257/71 |
| 6,346,717 B1 | 2/2002 | Kawata | 257/72 |
| 6,392,342 B1 | 5/2002 | Parikka | 313/512 |
| 6,393,183 B1 | 5/2002 | Worley | 385/39 |
| 6,403,395 B2 | 6/2002 | Hirabayashi et al. | 438/69 |
| 6,407,438 B1 | 6/2002 | Severn | 257/433 |
| 6,528,779 B1 | 3/2003 | Franz et al. | 250/214.1 |
| 6,542,522 B1 | 4/2003 | Arahira | 372/18 |
| 6,600,169 B2 | 7/2003 | Stinz et al. | 257/14 |
| 6,611,007 B2 | 8/2003 | Thompson et al. | 257/14 |
| 6,625,337 B2 | 9/2003 | Akiyama | 385/14 |
| 6,628,686 B1 | 9/2003 | Sargent | 372/46.01 |
| 6,628,691 B2 | 9/2003 | Hatori | 372/50 |
| 6,645,829 B2 | 11/2003 | Fitzgerald | 438/455 |
| 6,677,655 B2 | 1/2004 | Fitzgerald | 257/432 |
| 6,680,495 B2 | 1/2004 | Fitzgerald | 257/183 |
| 6,701,049 B1 | 3/2004 | Awad et al. | 385/122 |
| 6,768,754 B1 | 7/2004 | Fafard | 372/43.01 |
| 6,782,021 B2 | 8/2004 | Huang et al. | 359/256 |
| 6,813,423 B2 | 11/2004 | Goto et al. | 385/122 |
| 6,816,525 B2 * | 11/2004 | Stintz et al. | 372/45.01 |
| 6,826,205 B1 * | 11/2004 | Myers et al. | 372/18 |
| 6,862,312 B2 | 3/2005 | Fafard | 372/71 |
| 6,870,178 B2 * | 3/2005 | Asryan et al. | 257/14 |
| 2002/0030185 A1 | 3/2002 | Thompson et al. | 257/14 |
| 2002/0114367 A1 | 8/2002 | Stintz | 372/45 |
| 2003/0015720 A1 | 1/2003 | Lian et al. | 257/98 |
| 2003/0025118 A1 | 2/2003 | Yamazaki et al. | 257/664 |
| 2003/0063647 A1 * | 4/2003 | Yoshida et al. | 372/50 |
| 2003/0128728 A1 | 7/2003 | Shimizu et al. | |
| 2003/0165173 A1 | 9/2003 | Helbing et al. | |
| 2004/0009681 A1 | 1/2004 | Fafard | 372/39 |
| 2004/0057485 A1 | 3/2004 | Ohki et al. | |
| 2004/0065890 A1 * | 4/2004 | Alphonse et al. | 257/94 |
| 2004/0109633 A1 | 6/2004 | Pittman et al. | 385/16 |
| 2004/0228564 A1 | 11/2004 | Gunn et al. | |
| 2005/0008048 A1 | 1/2005 | McInerney et al. | 372/25 |
| 2005/0047727 A1 | 3/2005 | Shin et al. | |
| 2005/0175044 A1 | 8/2005 | Zakhluniuk et al. | |

OTHER PUBLICATIONS

L. F. Lester et al., "Optical Characteristics of 1.24-μm InAs Quantum-Dot Laser Diodes," IEEE Photonic Tech. Let, vol. 11, No. 8, pp. 931-933, 1999.*

Chuang S. L., Physics of Optoelectronic Devices. New York: John Wiley & Sons, 1995.*

U.S. Appl. No. 11/100,970, filed Apr. 2005, Kovsh.

A.R. Kovsh, et al., "3.5 W CW Operation of quantum dot laser," Electron. Lett. vol. 35, N. 14 Jul. 1999, pp. 1161-1163.

A.E. Zhukov, et al., "Control of the emission wavelength of self-organized quantum dots: main achievements and present status," Semicond. Sci. Technol. vol. 14, N.6, Apr. 1999, pp. 575-581.

G. Park, et al., "Low-threshold oxide-confined 1.3-um quantum-dot laser," IEEE photon technol. Lett. vol. 13, N. 3, Mar. 2000, pp. 230-232.

X. Huang, et al., "Passive mode-locking in 1.3 um two-section InAs quantum dot lasers," Appl. Phys. Lett. vol. 78, N. 19, May 2001, pp. 2825-2827.

M.G. Thompson, et al., "10 GHz hybrid modelocking of monolithic InGaAs quantum dot lasers," IEE Electron. Lett. vol. 39, N. 15, Jul. 2003, pp. 1121-1122.

M. Kuntz, et al., "GHz mode-locking of 1.3 mm quantum dot lasers," Appl. Phys. Lett. vol. 85, N. 5, Aug. 2004, pp. 843-845.

A.E. Avrutin et al., "Monolithic and Multi-GigaHertz mode-locked semiconductors lasers; Constructions, experiments, models and applications," IEE Proc. Optoelectron. vol. 147, N. 4, Aug. 2000, pp. 251-278.

K.A. Williams et al., "Long wavelength monolithic mode-locked diode lasers," New Journal of Physics, vol. 6, N. 179, Nov. 2004, pp. 1-30.

M.G. Thompson, et al. "Transform-limited optical pulses from 18 GHz monolithic modelocked quantum dot lasers operating at 1.3 um," IEE Electron. Lett. vol. 40, N. 5, Mar. 2004, pp. 346-347.

Jinno, "Correlated and uncorrected timing jitter in gain-switched laser diodes," IEEE Phot. Tech. Lett., vol. 5, pp. 1140-1143 (1993).

Leonard et al., "Direct formation of quantum-sized dots from uniform coherent islands in InGaAs on GaAs surfaces," Appl. Phys. Lett., vol. 63, pp. 3203-3205 (1993).

Lester et al., "Optical Characteristics of 1.24-um InAs Quantum-Dot Laser Diodes," IEEE Phot. Tech. Lett., vol. 11, pp. 931-933 (1999).

Liu et al., "Gain-Switched picosecond pulse (<10ps) generation from 1.3 um InGaAsP Laser Diodes," IEEE Quan. Elec., vol. 25, pp. 1417-1425 (1989).

Madhukar et al., "Nature of strained InAs three-dimensional island formation and distribution on GaAs(100)," Appl. Phys. Lett., vol. 64, pp. 2727-2729 (1994).

Moison et al., "Self-organized growth of regular nanometer-scale InAs dots on GaAs," Appl. Phys. Lett., vol. 64. pp. 196-198 (1994).

Reithmaier et al., "Single-mode distributed feedback and microlasers based on quantum-dot gain material," IEEE Selec. Top. In Quan. Elec., vol. 8, pp. 1035-1044 (2002).

Shoji et al., "Lasing Characteristics of self-formed quantum-dot lasers with Multisacked dot layer," IEEE Selec. Top. In Quan. Elec., vol. 3, pp. 188-195 (1997).

Sogawa et al., "Picosecond lasing dynamics of gain-switched quantum well lasers and its dependence on quantum well structures," IEEE Quan. Elec., vol. 27, pp. 1648-1654 (1991).

Zhang, L. et al. "Low Timing Jitter, 5 GHz Optical Pulse Form Monolithic Two-section Passively Mode Locked 1250/1310 nm Quantum Dot Lasers for High Speed Optical Interconnects" Optical Society of America, 2004.

Fan, H.; Wu, C.; Dutta, N.K.; Koren, U.; Piccirilli, A.B.; "Colliding pulse mode locked laser", (Lasers and Electro-Optics Society 1999 12th Annual Meeting. LEOS '99), IEEE vol. 2, Nov. 8-11, 1999, pp. 701-702.

Haring, R; Paschotta, R; Aschwanden, A; Gini, E; Morier-Genoud, F; Keller, U; "High-Power Passively Mode-Locked Semiconductor Lasers", IEEE J of Quantum Electronics, vol. 38(9), Sep. 2002, pp. 1268-1275.

Tamura, K. R.; Komukai, T.; Morioka, T.; "Modulation Requirements and Transmission Characteristics of Electrically Tunable Mode Locked Lasers with Fiber Bragg Gratings", IEEE Photonics Technology Letters, vol. 14(6), Jun. 2002, pp. 834-836.

Yokoyama, H.; Hashimoto, Y.; Kurita, H.; Ogura, I.; Shimizu, T.; Kuribayashi, R.; Shirane, M.; Yamada, H.; "Highly reliable mode-locked semiconductor lasers and their applications" The 4th Pacific Rim Conference on Lasers and Electro-Optics, 2001. CLEO/Pacific Rim 2001. vol. 2, pp. II-498-II-499.

H. Benisty, C. M. Sotomayor-Torres, and C. Weisbuch, "Intrinsic mechanism for the poor luminescence properties of quantum-box systems", *Phys. Rev. B* 44(19), Nov. 1991, pp. 10945-10948.

G. Park, D. L. Huffaker, Z. Zou, O. B. Shchekin, D. G. Deppe, "Temperature dependence of lasing characteristics for long-wavelength (1.3-μm) GaAs-based quantum-dot lasers", *IEEE Photon. Technol. Lett.* 11(3), Mar. 1999, pp. 301-303.

M. Sugawara, K. Mukai, Y. Nakata, "Light emission spectra of columnar-shaped self-assembled InGaAs/GaAs quantum-dot lasers: Effect of homogeneous broadening of the optical gain on lasing characteristics", Appl. Phys. Lett. 74(11), Mar. 1999, pp. 1561-1563.

S. S. Mikhrin, A. E. Zhukov, A. R. Kovsh, N. A. Maleev, V. M. Ustinov, Yu. M. Shernyakov, I. N. Kayander, E. Yu. Kondrat'eva, D. A. Livshits, I. S. Tarasov, M. V. Maksimov, A. F. Tsatsul'nikov, N. N. Ledentsov, P. S. Kop'ev, D. Bimberg, Zh. I. Alferov, "A spatially single-mode laser for a range of 1.25-1.28μm on the basis of InAs quantum dots on a GaAs substrate", Semiconductors 34(1), 119-121 (2000).

M. Grundmann, F. Heinrichsdorf, N. N. Ledentsov, C. Ribbat, D. Bimberg, A. E. Zhukov, A. R. Kovsh, M. V. Maximov, Yu. M. Shernyakov, V. M. Ustinov, Zh.I.Alferov, "Progress in quantum dot lasers: 1100 nm, 1300 nm, and high power applications", Jpn. J. Appl. Phys. 39(Part 1, N.4B), Apr. 2000, pp. 2341-2343.

O. B. Shchekin and D. G. Deppe, The role of p-type doping and the density of states on the modulation response of quantum dot lasers, Appl. Phys. Lett. 80(15), Apr. 2002, pp. 2758-2760.

A. Markus, J. X. Chen, C. Paranthoen, A. Fiore, C. Platz, O. Gauthier-Lafaye, Simultaneous two-state lasing in quantum-dot lasers, Appl. Phys. Lett. 82(12), Mar. 2003, pp. 1818-1820.

A. E. Zhukov, A. R. Kovsh, D. A. Livshits, V. M. Ustinov Zh. I. Alferov, Output power and its limitation in ridge-waveguide 1.3 μm wavelength quantum-dot lasers, Semicond. Sci. Technol. 18(8), Jul. 2003, pp. 774-781.

A. Markus; A. Fiore, Modeling carrier dynamics in quantum-dot lasers, Phys. stat. sol. (a) 201 (2), Jan. 2004, pp. 338-344.

S. Fathpour, Z. Mi, P. Bhattacharya, A. R. Kovsh, S. S. Mikhrin, I. L. Krestnikov, A. V. Kozhukhov, and N. N. Ledentsov, The role of Auger recombination in the temperature-dependent output characteristics (T0=∞) of p-doped 1.3 μm quantum dot lasers, Appl. Phys. Lett. 85(22), Nov. 2004, pp. 5164-5166.

Ribbat et al. "High Power Quantum Dot Lasers at 1160 nm" Phys. stat. sol., vol. 224, No. 3, 819-822. 2001.

Avrutin et al. "Dynamic Modal Analysis of Monolithic Mode-Locked Semiconductor Lasers" IEEE Journal of Selected Topics in Quantum Electronics, IEEE Service Center, Piscataway. NJ, US, vol. 9, No. 3, May 2003.

Gubenko et al. "Mode-Locked at 9.7 Ghz Repetition Rate With 1.7 ps Pulse Duration in Two-Section QD Lasers." IEEE Journal of Selected Topics in Quantum Electronics, IEEE Service Center, Piscataway. NJ, US, vol. 9, No. 3, May 2003.

Bagley et al. "Broadband Operation of InGaAsP-InGaAs Grin-SC-MQW BH Amplifiers with 115mW Output Power." Electronics Letters, IEE Stevenage, GB, vol. 26, No. 8, Apr. 14, 1990.

International Search Report and Written Opinion dated Mar. 14, 2008 for PCT/EP2007/010313.

P. Eliseev, Tunable Grating-Coupled Laser Oscillation and Spectral Hole Burning in an InAs Quantum-Dot Laser Diode, IEEE Journal of Quantum Electronics, Apr. 2000, pp. 479-485, vol. 36 No. 4.

* cited by examiner

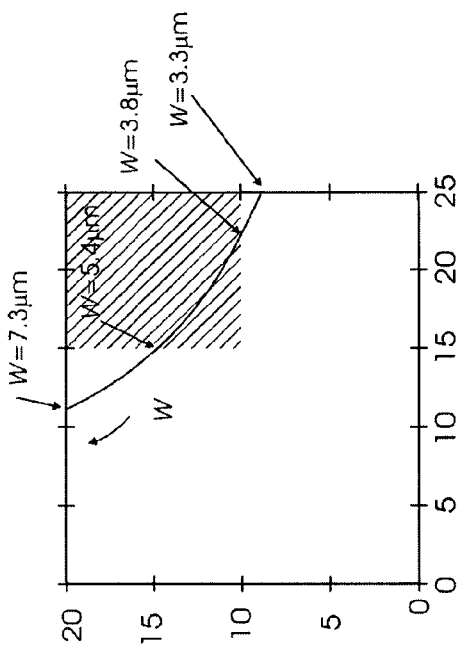
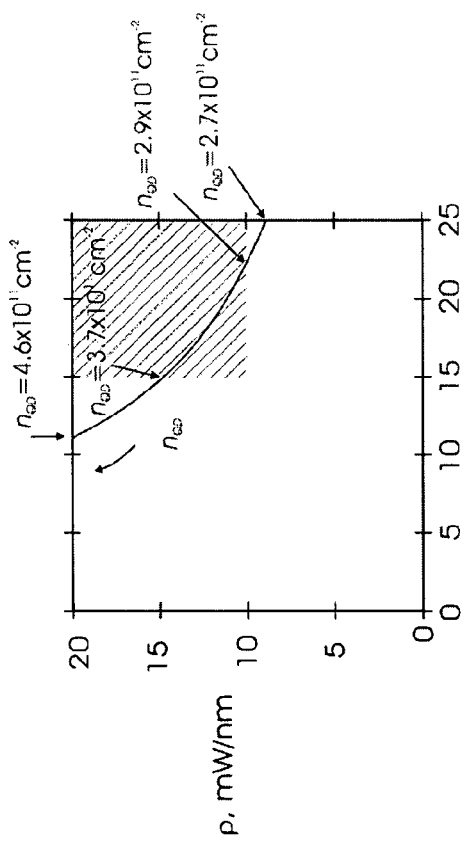
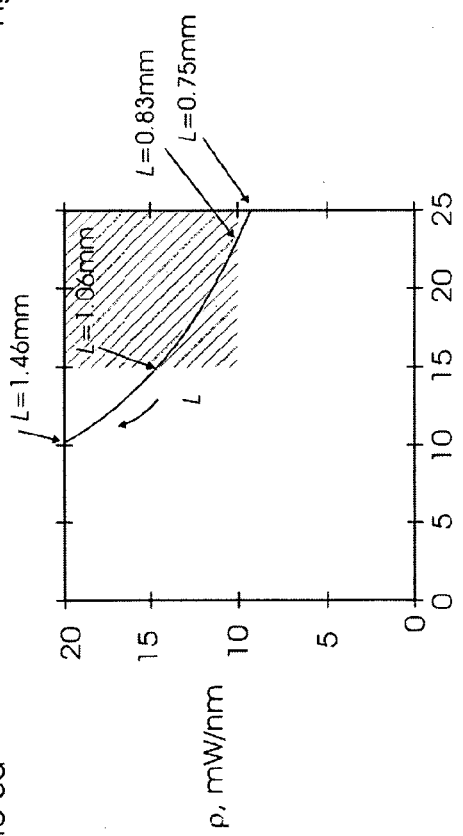
Figure 6a
Figure 6b
Figure 6c

LASER SOURCE WITH BROADBAND SPECTRUM EMISSION

BACKGROUND OF THE INVENTION

1. Field of the Invention

This invention pertains to semiconductor lasers and, more specifically, to semiconductor lasers having a broad spectrum of emission.

2. Description of Related Art

Although narrow-band spectral output is often appreciated for a laser, a lasing spectrum which has a broad spectral bandwidth is desirable for certain applications. In particular, a laser spectrum with many longitudinal modes is quite desirable for a mode-locked laser because the pulse width is, in general, inverse to the spectral bandwidth. Also, a broadband laser spectrum is useful in optical communication systems provided that the output radiation is spectrally split into several independent channels. Such a system can be based on a single broadband laser and, therefore, can be advantageous in terms of fabrication simplicity and lower cost compared to more common wavelength division multiplexing (WDM) systems based on several lasers, in which each wavelength channel requires its own laser source.

Optical generating devices with a very broad spectrum of optical emission, the so-called super-continuum, are known in the art. These devices usually exploit the propagation of a short optical pulse through a sufficiently long strongly non-linear optical substance, e.g. optical fiber, as described, for example, in U.S. Pat. No. 6,813,423. Although the spectral range of emission can be very large (e.g. several hundred nanometers), such devices are usually not very compact.

A light-emitting diode (LED) and a superluminescent light-emitting diode (SLED) are capable of emitting in a broad spectral range. However, these devices are typically characterized by low efficiency compared to a laser device, and their output power is typically low. Therefore, when used as an optical source for a WDM system, a LED or a SLED only provides limited power per spectral channel of the WDM system.

An example of a broadband laser source is disclosed in U.S. Pat. No. 6,628,686. This patent describes a laser that has an InGaAsP active structure with modified effective bandgap energy. The spatially varying emission spectrum allows emission at multiple wavelengths or emission in a broad band. This solution, however, suffers from complexity in the fabrication method, which exploits post-growth modification of bandgap properties by rapid thermal annealing, as disclosed in U.S. Pat. No. 6,611,007.

Because the bandwidth of the emission spectrum of the laser is fundamentally limited by the width of the optical gain spectrum, it is desirable for a broadband laser to include an active region with a broad gain spectrum. This is easily achieved with a quantum dot array. A quantum dot is a three-dimensional semiconductor structure which has a size of the order of a de-Broglie wavelength, thereby producing quantization of the energy levels of the confined electrons and holes. Stranski-Krastanow quantum dots, also known as self-organized quantum dots (hereinafter quantum dots), have appeared recently as a practical realization of ideal quantum dots.

Quantum dots formed by self-organization epitaxial methods are typically characterized by the inhomogeneous broadening of quantum states caused by inevitable non-uniformities of dimensions, chemical composition, shape, strain, as well as other parameters of quantum dots affecting the quantum state energies in quantum dots. Although a high degree of uniformity is usually appreciated in quantum dots which are intended for use in light-emitting devices, a certain amount of non-uniformity can provide a significant inhomogeneous broadening of quantum dot states and, therefore, a broad gain spectrum under certain pump levels.

Other properties of quantum dots when used in a laser's active region including, but not limited to, low threshold current density, low alpha-factor, reduced temperature sensitivity, and extended wavelength range of emission, also make a quantum dot laser advantageous over a quantum well laser for certain applications.

U.S. Pat. No. 6,768,754 discloses a tunable laser system, which includes a quantum dot laser active region with a gain spectrum that extends continuously over a broad wavelength range of at least one hundred nanometers. Another example of a tunable laser system, U.S. Pat. No. 6,816,525, describes a method that is capable of producing inhomogeneous broadening of the optical gain spectrum, which is beneficial for tunable lasers and arrays of lasers that have a wide range of operating wavelength. A tunable laser of the prior art typically included a quantum dot active region, which is capable of providing a sufficient optical gain in a wide optical band, and a wavelength-selective element (e.g., an element having a reflectivity that is a function of wavelength) for selecting a wavelength of interest emitted by the laser diode.

One benefit of prior art quantum dot tunable lasers is that the large tuning range of the quantum dot active region permits a multi-wavelength laser array to be fabricated from a single quantum dot laser wafer, the array having a large number of different operation wavelengths for wavelength division multiplexed applications. One disadvantage of prior art multi-wavelength laser arrays is that an optical source for an N-channel WDM system should include at least N laser devices. This results in additional complexity in fabrication and additional expense. Therefore, there is a need in the art for a compact and inexpensive optical source for a WDM system which includes only a single laser device.

SUMMARY OF THE INVENTION

The present invention discloses a compact and inexpensive laser device, simple to fabricate, capable of emitting a broadband (preferably at least 15 nm) spectrum at a high-power level (preferably at least 100 mW and more preferably at least 150 mW, which corresponds to 10 mW per 1 nm). This combination of parameters makes such a laser device useful as an optical source for WDM-systems, and replaces a number of complex and expensive lasers, e.g. tunable lasers.

BRIEF DESCRIPTION OF THE DRAWINGS

FIG. 4b shows the emission spectra of the quantum dot laser of FIG. 4a.

FIG. 6a shows a correlation between the spectral bandwidth and the spectral power density in a quantum dot laser with a variable number of quantum dots in the active region, where the number of quantum dots is adjusted by varying the surface density of quantum dots per plane or the number of quantum dot planes.

FIG. 6b shows a correlation between the spectral bandwidth and the spectral power density in a quantum dot laser with a variable number of quantum dots in the active region, where the number of quantum dots is adjusted by varying the width of the laser.

FIG. 6c shows a correlation between the spectral bandwidth and the spectral power density in a quantum dot laser with a variable number of quantum dots in the active region, where the number of quantum dots is adjusted by varying the length of the laser.

DETAILED DESCRIPTION OF THE INVENTION

Figure 1B:
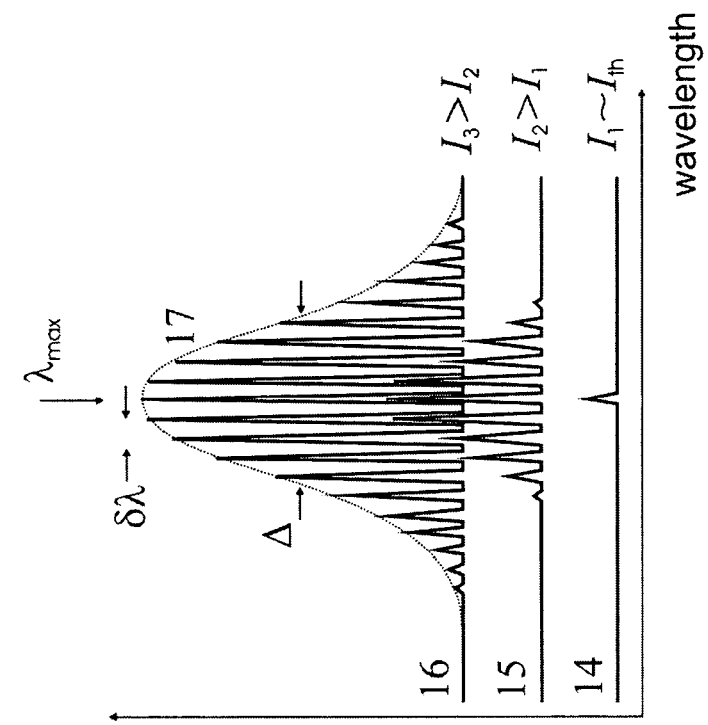
FIG. 1b shows a prior art laser emission spectra at different pump levels that demonstrate multi-frequency lasing with a progressive broadening of the overall spectral width.

The present invention features a quantum dot laser that includes a semiconductor quantum dot active region located in a semiconductor matrix. The quantum dots are capable of localizing carriers of both types (i.e., electrons and holes), and have at least one (ground) state quantum energy level for carriers of each type. These ground state energy levels are inhomogeneously broadened due to variation in the quantum dot dimensions, their shape or other parameters affecting the quantum energy level.

The laser is capable of operating in the ground-state optical transition of quantum dots, where the active region of the laser, the laser design and operation conditions are optimized such that the spectral width of the output lasing spectrum is preferably at least 15 nm and the optical power is preferably at least 100 mW. In a preferred embodiment, the optical power is at least 150 mW.

In a preferred embodiment, the spectral power density is preferably at least 7 mW/nm. In a more preferred embodiment, the spectral power density is preferably at least 10 mW/nm. The examples discuss herein show embodiments where the spectral power density is at least 10 mW/nm. However, in some applications, 10 mW/nm may be too excessive and a lower spectral power density (e.g. 5 mW/nm) is sufficient.

With the combination of a large bandwidth and a high spectral power density, the broadband laser's emission spectrum can be spectrally split into several independent spectral channels, and the output power in at least one spectral channel is sufficiently high, e.g. more than 10 mW. This permits a broadband quantum dot laser to be used as the principle component of an optical source for a WDM system that includes a single laser source.

More specifically, special measures may be provided to ensure operation of the quantum dot laser with sufficient bandwidth and with sufficient spectral power density. These measures may include, but are not limited to, the control of the maximum useful pump level; the control of the total number of quantum dots in the laser active region; the control of carrier relaxation to the quantum dot ground states; and the control of carrier excitation from the quantum dot ground states. In one embodiment, a spectrally-selective loss is introduced to the laser resonator in order to suppress pump-induced lasing on a quantum dot excited-state optical transition, thereby extending the dynamic range of the ground-state lasing and increasing the bandwidth/spectral power density of the emission spectrum of the laser.

Laser Parameters

In order to achieve laser operation, the active region should provide an optical gain that is sufficient to balance the total optical loss in the laser cavity. In a semiconductor medium, the optical gain is typically distributed over a certain spectral range referred to as the optical gain spectrum. The specific shape of the gain spectrum is determined by the density of states of the semiconductor and, to a certain extent, by the pump level.

Figure 1A:
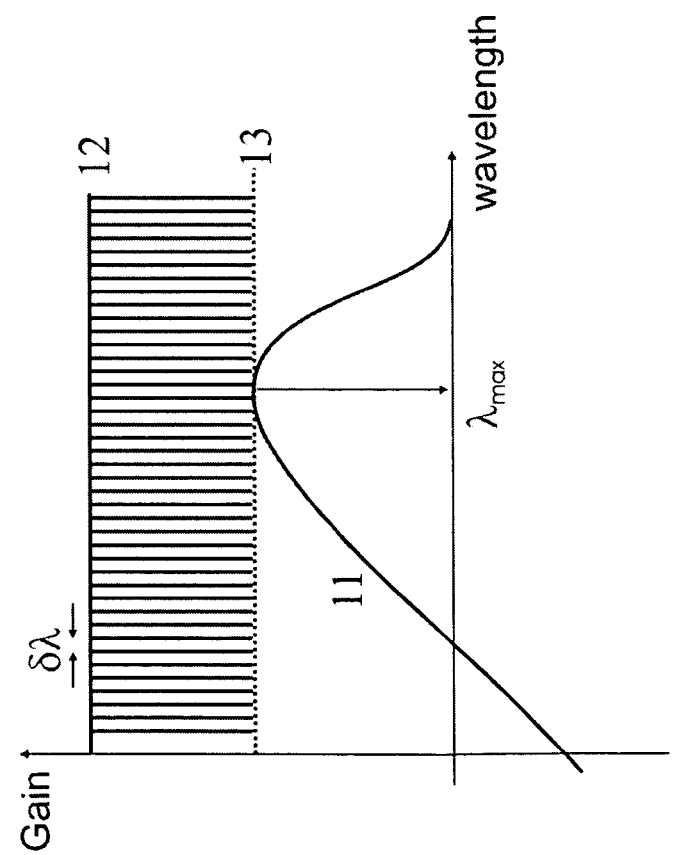
FIG. 1a shows the prior art relationship between the optical gain spectrum and the spectrum of cavity modes.

Referring to FIG. 1a, curve 11 shows a typical dependence of the optical gain of a semiconductor laser on the wavelength. A wavelength, which corresponds to the maximum of the gain spectrum, is denoted as $\lambda_{max}$. Curve 12 shows a spectral dependence of the optical loss in the laser resonator. It represents a series of relatively narrow cavity resonances also referred to as cavity longitudinal modes. Typically many longitudinal modes are located within the gain spectrum, as illustrated in FIG. 1a. There is a separation ($\delta\lambda$) between neighboring longitudinal modes.

Optical gain arises in response to pumping (I), e.g. via the drive current or the optical pump power. As the pumping reaches a certain level, known as the laser threshold ($I_{th}$), the maximum of the gain spectrum approximately reaches the level of the total optical loss (illustrated by dotted line 13). Typical spectra of the laser emission 14, 15, and 16 at various pump levels, $I_1$, $I_2$, and $I_3$, respectively, are shown in FIG. 1b. At first, when the pump level is close to the laser threshold ($I_1 \sim I_{th}$), lasing starts at a wavelength of the longitudinal mode which approximately corresponds to the maximum of the gain spectrum (curve 14).

As the pump level increases above the threshold ($I_2$ and $I_3$), the laser's output power increases. Ideally, the output spectrum remains at the wavelength of the longitudinal mode where the maximum gain is achieved, which corresponds to a single narrow line. However, if special measures are not provided in order to ensure single-frequency laser operation, the spectrum typically includes a number of longitudinal modes of the cavity which are spectrally located close to the wavelength of the gain maximum (curves 15 and 16). Moreover, the number of longitudinal modes involved in the laser operation increases with an increase in the pump level, as is illustrated in FIG. 1b. This means that the overall spectral width (Δ) of the emission spectrum, i.e. a width of an enveloping spectral curve 17, becomes broader as the pump level increases.

Figure 2:
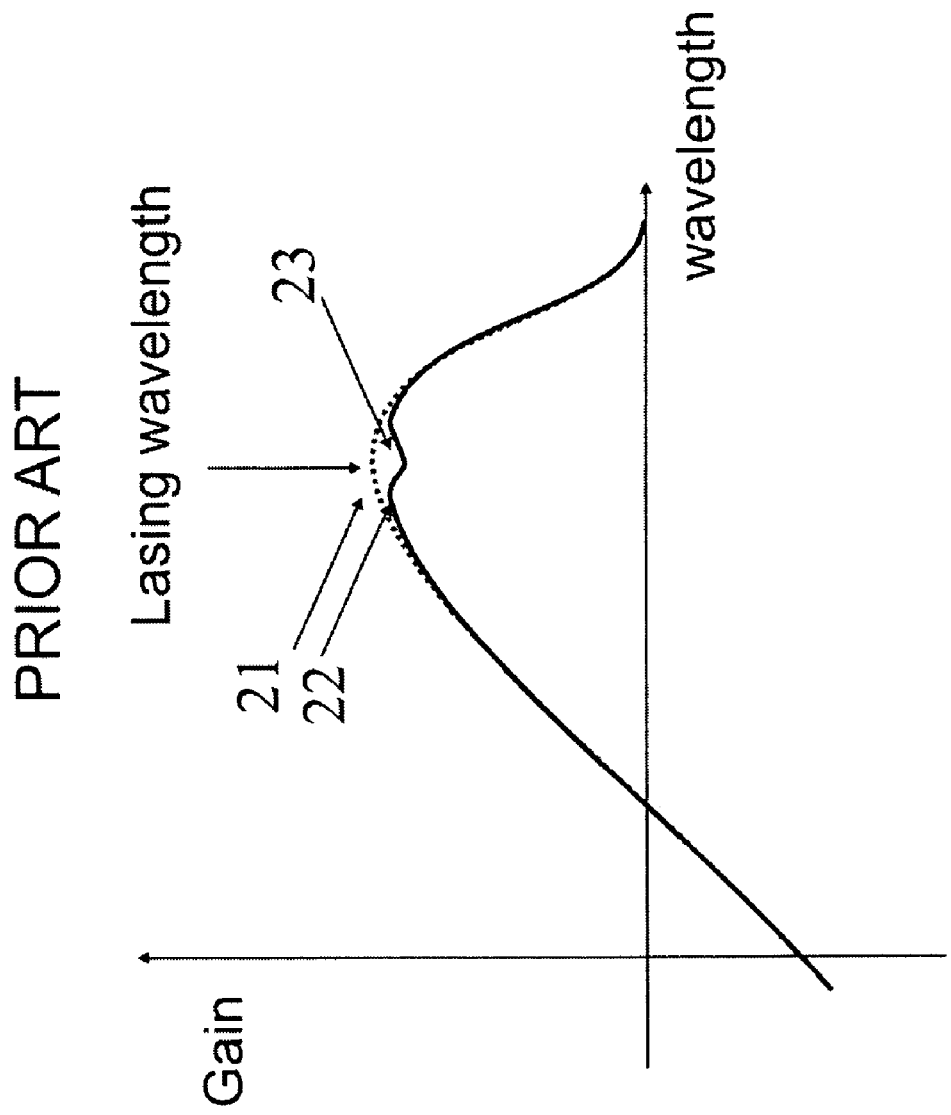
FIG. 2 illustrates prior art spectral hole burning at the lasing wavelength.

Multi-frequency lasing originates due to two reasons. The first reason has already been mentioned—close spectral spacing of neighboring modes compared to the width of the gain spectrum. As a result, several modes are located in close proximity to the gain maximum. A second reason which is of fundamental nature, is inhomogeneous gain saturation, a phenomenon sometimes called spectral hole burning. This phenomenon reduces the optical gain around the lasing wavelength with optical power. As schematically shown in FIG. 2, the initial gain spectrum 21 transforms at high pump levels into curve 22 because of formation of a so-called "spectral hole" 23. In short, the empty state created by stimulated emission must be refilled before the next stimulated recombination event takes place. A limited rate of this refilling process results in a lack of carriers at the electronic states involved in lasing. Inhomogeneous gain saturation can make it difficult to achieve stable single-frequency operation because the side (non-lasing) modes become favored in terms of gain. As a result, more modes are excited at elevated pump levels.

The inhomogeneous gain saturation can be found in different gain media, in particular, in semiconductor lasers. Fundamentally, the bandwidth of the laser emission spectrum is limited by the spectral width of the gain spectrum. In this aspect, the semiconductor active region is favored for achieving broadband laser emission since the gain spectrum is quite broad compared to typical solid-state lasers. Moreover, a semiconductor laser can be very compact and inexpensive. However, the spectral width of the multi-frequency QW laser is typically below 10 nm because the effect of the inhomogeneous gain saturation is relatively low. The latter fact is associated with very fast carrier excitation/relaxation processes in a quantum well. As soon as empty electronic states become available after a photon emission by the stimulated emission process, charge carriers quickly refill these states making them ready for another photon emission event.

A very different situation takes place in an array of quantum dots. In contrast to a quantum well, quantum dot electronic states of different energy within an inhomogeneously broadened ground-state level belong to spatially separated quantum dots having different sizes, shapes or other parameters which affect the quantum energy. Therefore, in a quantum dot laser, only a certain portion of the available quantum dots contributes to the lasing process, namely those quantum dots which have an optical transition energy approximately equal to the lasing transition. Other quantum dots act as a reservoir providing charge carriers to the lasing dots. However, such an interaction can be strongly suppressed because a charge carrier should be first excited from the first quantum dot to a matrix or a wetting layer, then travel across the active region to a second dot, and finally be captured by the second dot. As a result, a refilling process may be significantly slowed down in a quantum dot laser, and therefore, broadening of the laser's emission spectrum by side modes can be significantly enhanced.

Significant broadening of an emission spectrum, possible in a quantum dot laser, is beneficial in view of the objectives of the present invention. The broadband emission spectrum may be spectrally split into several independent spectral channels, provided that the bandwidth is sufficient, e.g. more than 15 nm. Therefore, a broadband quantum dot laser may be used as a principle component of an optical source for a WDM system that includes a single laser source. This avoids additional complexity in fabrication and additional expense as compared to prior art optical sources, which include multi-wavelength laser arrays.

In addition to a sufficient bandwidth of the emission spectrum, it is desirable for a quantum dot laser to be capable of providing a sufficient optical power per channel. To achieve this, a quantum dot laser has to provide sufficient optical power of the output radiation or, in other words, sufficient spectral power density. However, the requirements of large bandwidth and high spectral power density are often contradictory to each other. Indeed, as is evident from the above discussion, slow relaxation of charge carriers to the quantum dot states is favorable for broadband laser operation. However, slow carrier relaxation have been predicted to result in poor efficiency in luminescence and laser action (for example, Benisty et al. "Intrinsic mechanism for the poor luminescence properties of quantum-box systems", Phys. Rev. B 44(19), November 1991, pp. 10945-10948) and, therefore, in low output power from a quantum dot laser.

The emission spectrum is primarily determined by the ratio of the number of quantum dots involved in the lasing process, $N_{las}$, to the total number of quantum dots, $N_{QD}$. The latter is just a product of the active region area, WL (where W is the laser stripe width, L is the cavity length), and the effective surface density of quantum dots, $n_{QD}$ (a surface density of quantum dots per epitaxial plane multiplied by a number of quantum dot planes in the laser's active region):

$$\frac{\Delta}{\sigma} \approx \frac{N_{las}}{n_{QD} WL} \qquad (1)$$

If nearly all the dots of the active region contribute to lasing ($N_{las} \approx N_{QD}$), then the bandwidth of the laser emission spectrum, Δ, is approximately equal to the spectral width of the inhomogeneously broadened ground-state optical transition, σ. However, if only a few quantum dots, for which optical transition energies are approximately equal to the lasing transition energy, contribute to lasing, then the bandwidth is quite narrow (e.g. on the order of the width of a single longitudinal mode).

The number of quantum dots which contribute to lasing can be estimated if one takes into account that the recombination current through a single quantum dot can not exceed its maximum value $I_{QD}$, which is limited by the rate of carrier relaxation (capture) to the quantum dot ground-state level:

$$I_{QD} \approx \frac{2e}{\tau_C}, \qquad (2)$$

where e is the electron charge, and $\tau_C$ is the carrier capture time to the quantum dot ground-state level. Factor 2 accounts for the spin degeneracy of the ground-state level.

The output power is given as:

$$P \approx \frac{\varepsilon}{e}\eta_D(I - I_{th}), \qquad (3)$$

where $\varepsilon$ is the photon energy of the ground-state optical transition, $\eta_D$ is the differential quantum efficiency, I is the pump level, and $I_{th}$ is the laser threshold.

The spectral power density, $\rho$, is then estimated as an average spectral power density, a ratio of the total output power of the quantum dot laser, P, to the bandwidth of the emission spectrum:

$$\rho \approx \frac{P}{\Delta}. \qquad (4)$$

The laser threshold depends on the active region area, the optical loss in the laser, the saturated gain (a maximum level of the optical gain, which is available on the ground-state optical transition), the carrier relaxation time to the quantum dot ground-state level, the laser carrier excitation from the quantum dot ground-state level, and the time of carrier radiative recombination. The differential quantum efficiency depends on the optical loss in the laser and, in particular, on the internal loss and the carrier relaxation time to the quantum dot ground-state level. Certain other parameters may also affect, to some extent, the threshold and the differential quantum efficiency of a quantum dot laser.

Figure 3B:
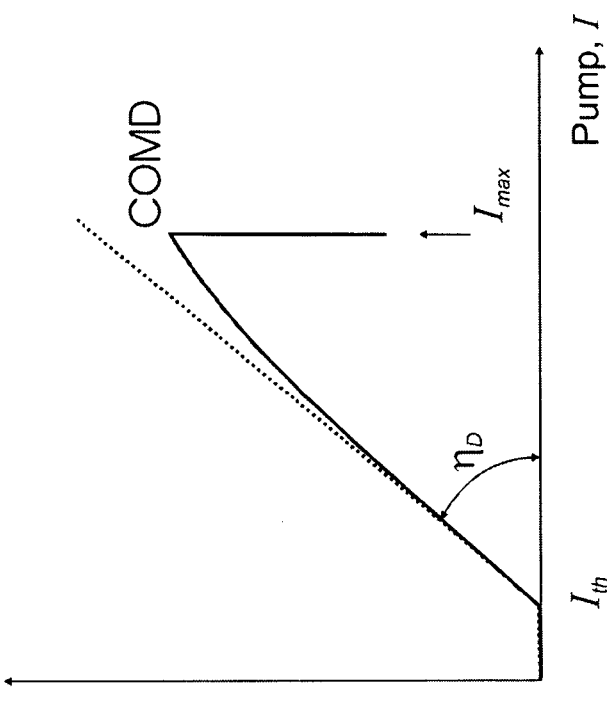
FIG. 3b illustrates catastrophic optical mirror damage, which limits the maximum useful power of a laser.
Figure 3A:
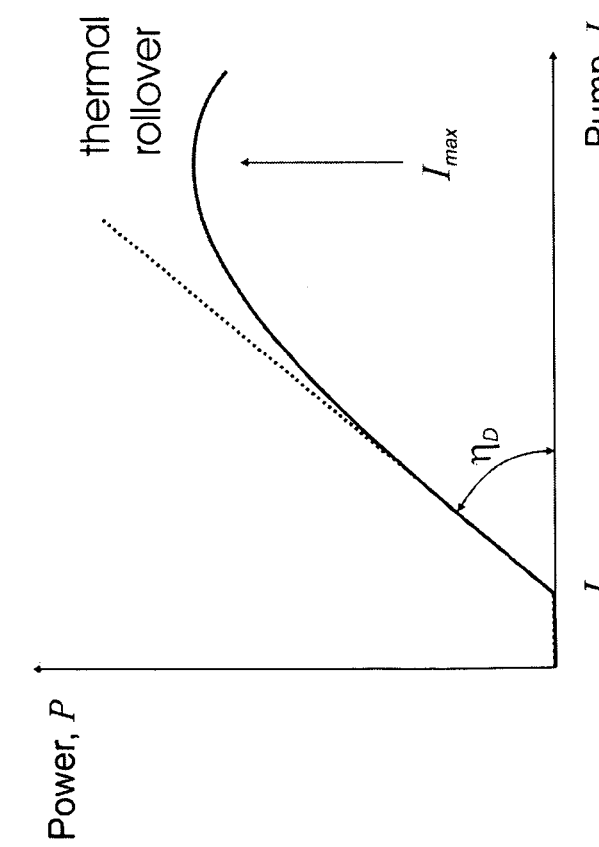
FIG. 3a illustrates thermal rollover, which limits the maximum useful power of a laser.

The output power increases with increasing pump level. However, certain effects may limit the maximum useful pump level, $I_{max}$ and, therefore, limit the maximum useful power from a quantum dot laser. One of these effects, illustrated in FIG. 3a, is thermal rollover, i.e. a saturation of the output power with the pump level, caused by rise in the temperature of the active region and also caused by the sensitivity of the characteristics of the laser (threshold and differential efficiency) to temperature. Another effect is catastrophic optical mirror damage (COMD), which is a sudden, irreversible, and rapid degradation of the output mirror (facet) of the laser as the output power reaches a certain dangerous level, as illustrated in FIG. 3b.

A further effect that can limit the useful pump level is pump-induced excited-state lasing. In addition to the ground-state (GS) energy levels, quantum dots often confine at least one excited-state (ES) energy level. Although all the levels are inhomogeneously broadened, spectral bands, which correspond to these optical transitions, are well-separated (e.g. about 100 nm) and can easily be distinguished in optical experiments. Ground-state lasing is usually appreciated for a quantum dot laser. The quantum dot active region is typically designed so that the spectral band of the ground-state optical transition hits a useful wavelength interval for a certain application. At the same time, the well-separated spectral band of the excited-state optical transition can miss the useful wavelength interval for the application.

Figure 4B:
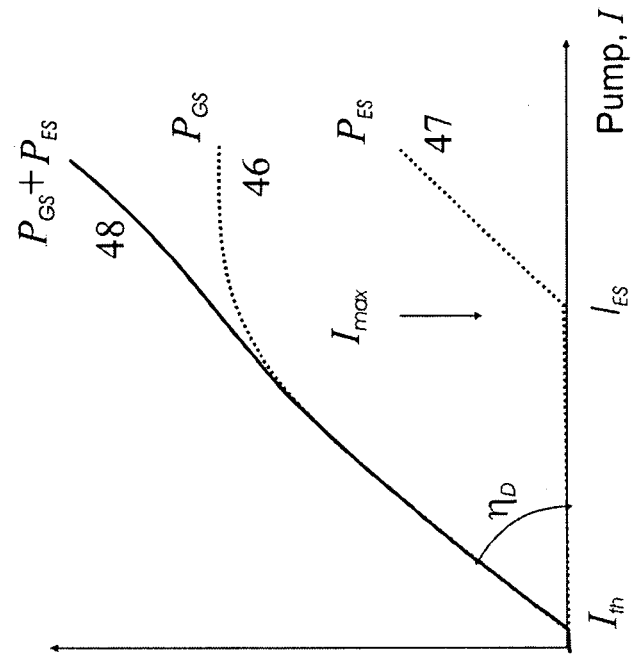
Figure 4A:
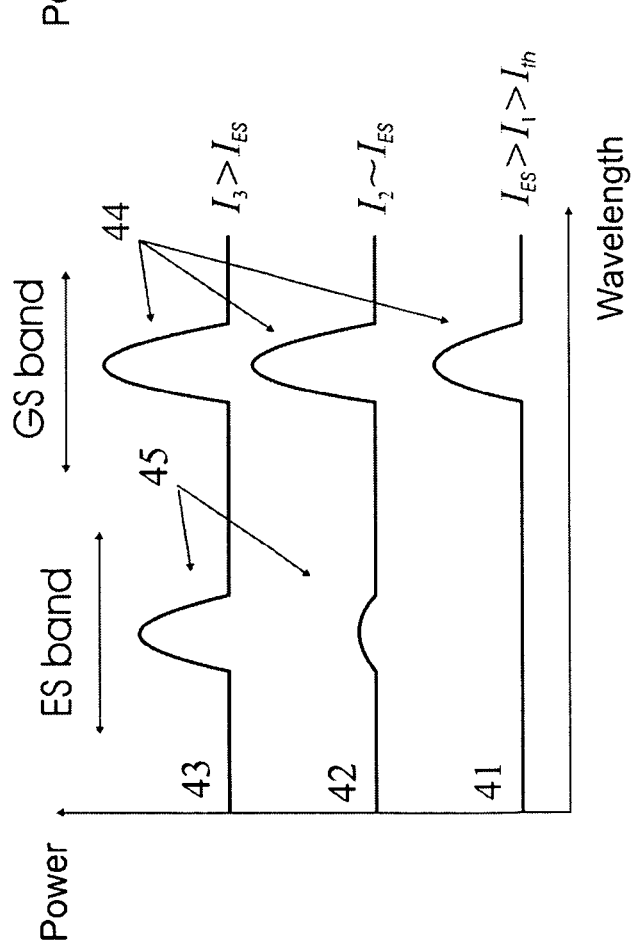
FIG. 4a illustrates pump-induced excited-state lasing in a quantum dot laser, which limits the maximum useful power of the laser.

FIG. 4a schematically shows emission spectra 41, 42, 43 of a quantum dot laser at various pump levels $I_1$, $I_2$, and $I_3$. If the pump level is relatively low ($I_1$), the emission spectrum contains the only spectral band 44 which corresponds to the wavelengths of the ground-state optical transition (curve 41). As the pump level reaches a certain value ($I_2$), which is often referred to as a threshold of the excited-state lasing ($I_{ES}$), an additional shorter-wavelength band 45 may appear in the laser emission spectrum (curve 42).

FIG. 4b illustrates dependence of the output power on pump level for the quantum dot laser of FIG. 4a. Curve 46 corresponds to the power of the ground-state band 44 of the emission spectrum ($P_{GS}$); curve 47 corresponds to the power of the excited-state band 45 of the emission spectrum ($P_{ES}$), and curve 48 corresponds to the total power of the laser ($P_{GS}+P_{ES}$). Power 46 of the ground-state band saturates as the pump level (I) increases above the threshold of the excited-state lasing ($I_{ES}$) Further growth of the total power of the emission is solely caused by an increase in the power of the excited-state band, as illustrated in FIG. 4b.

It is assumed that slow carrier capture/relaxation to and efficient thermo-ionic emission out of the ground-state level in combination with the finite number of the quantum dots in the active region are responsible for the limitation of the output power available on the ground-state optical transition.

Broadband Highpower Quantum Dot Laser

The present invention provides a method for optimization of a quantum dot active region and a laser design that maximizes the bandwidth of the emission spectrum and preferably simultaneously achieves a sufficiently high spectral power density. Accordingly, the laser of the present invention preferably includes control measures, which control the spectral bandwidth and the optical power. These measures may include, but are not limited to, the control of maximum useful pump level, the control of total number of quantum dots in the laser active region, and the control of carrier relaxation to and excitation from the quantum dot ground states.

As a result, the bandwidth of the laser's emission spectrum is preferably at least 15 nm and the optical power is at least 100 mW. In a preferred embodiment, the optical power is at least 150 mW.

Implementation of the present invention is illustrated herein by way of examples for a specific quantum dot active region. This quantum dot active region, as described in detail in the preferred embodiment, is based on an InAs/InGaAs epitaxial system and is capable of emitting at approximately 1.3 μm. If not specifically indicated, the following set of parameters is assumed:

Cavity length: 1 mm
Cavity width: 5 μm
Facet reflectivity: 100%/10%
Pump level: equivalent to 300 mA drive current in CW regime
Saturated gain: 6 cm$^{-1}$ per quantum dot plane
Internal loss: 3 cm$^{-1}$
Carrier relaxation time to the ground-state level: 2 ps
Carrier excitation time from the ground-state level: 20 ps
Carrier radiative lifetime: 1ns
Photon energy: 0.95 eV
In-plane quantum dot density: $5\times10^{10}$ cm$^{-2}$
Number of quantum dot planes: 7
Inhomogeneous broadening of the ground-state level: 50 nm Some of these parameters are varied in order to demonstrate their effect on spectral and power characteristics.

The laser parameters which are targeted in this illustrative example include the bandwidth of the emission spectrum, $\Delta$, which is preferably at least 15 nm, and the average spectral power density, $\rho$, which is preferably at least 10 mW/nm, so that the total optical power, P, is at least 150 mW. Alternative embodiments include more relaxed parameters. Some examples include a total optical power of at least 100 mW and/or a spectral power density of at least 7 mW/nm. Another example includes even smaller spectral power densities for certain applications.

Although the present invention is illustrated with reference to a specific set of required laser parameters and a specific quantum dot active region, it should be evident to those skilled in the art that the methods of the present invention may be efficiently implemented in other quantum dot active regions and for other sets of required parameters, without deviating from the spirit of the invention.

Control of Maximum Useful Pump Level

Figure 5:
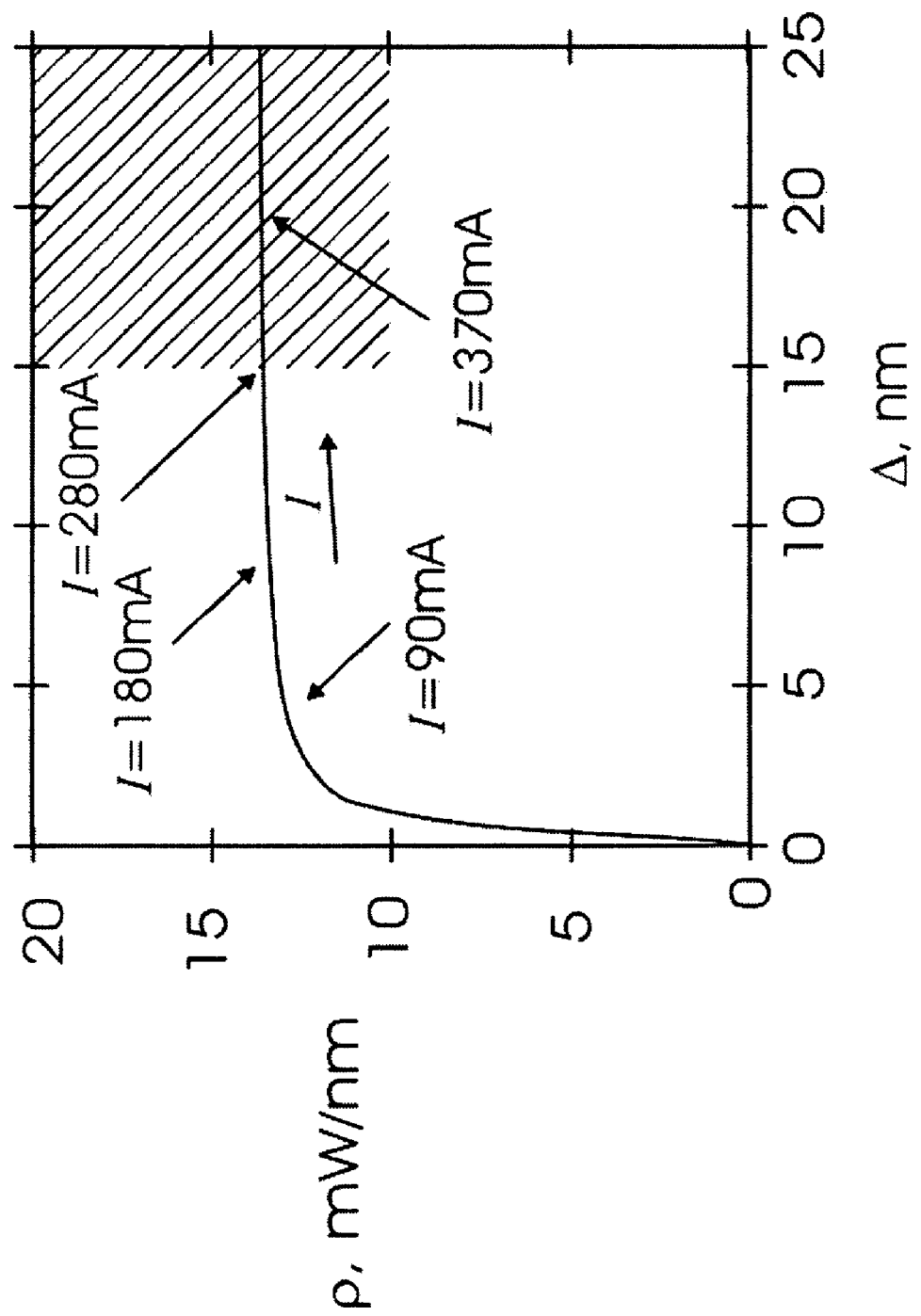
FIG. 5 shows the correlation between the spectral bandwidth and the spectral power density in a quantum dot laser with a variable pump level.

The effect of the pump level (I) on the characteristics of the laser is illustrated in FIG. 5, in which the spectral power density, $\rho$, is shown as a function of the bandwidth, $\Delta$. The different points of the $\rho$-$\Delta$ curve correspond to different pump levels in which the pump level increases from the left-hand end of the curve to the right-hand end. A hatched region in FIG. 5 represents the field of the laser characteristics which satisfy the desired parameters ($\Delta \geq 15$ nm, $\rho \geq 10$ mW/nm).

As the pump level increases, the bandwidth of the emission spectrum increases due to the previously mentioned effect of the limited rate of carrier relaxation to the quantum dot ground-state level. Simultaneously, the output power of the quantum dot laser increases. Initially, the power rises faster than the bandwidth. As a result, the spectral power density increases. In FIG. 5, this initial part of the the $\rho$-$\Delta$ curve corresponds to pump levels less than approximately 90 mA.

At higher pump levels (I>180 mA), the output power and the bandwidth of the emission spectrum change linearly to each other. As a result, the spectral power density saturates at a certain level, which is approximately 13 mW/nm for the present set of parameters. However, because the bandwidth continues rising with the pump level, the bandwidth may be sufficiently large. For the data of FIG. 5, the bandwidth becomes as large as 15 nm at the 280 mA-pump level. The bandwidth may be even larger, e.g. 20 nm, if the pump level is further increased to 370 mA.

This example demonstrates that the bandwidth of the laser's emission spectrum can exceed 15 nm while the spectral power density can exceed 10 mW/nm, provided that the parameters of the quantum dot active region and the laser design are properly optimized. In this example, the pump level can also reach sufficiently high values.

However, the characteristics of the laser can not satisfy the desired parameters ($\Delta \geq 15$ nm, $\rho \geq 10$ mW/nm) if the pump level is unable to reach sufficiently high values. For example, if the useful pump level of the quantum dot laser is limited to 180 mA for certain reasons (e.g., catastrophic optical mirror damage), the bandwidth, in accordance with data presented in FIG. 5, may not exceed 10 nm. Therefore, the quantum dot laser of the present invention provides control measures to increase the maximum useful pump level. In one embodiment, the maximum useful pump level is increased by suppressing the thermal rollover of the output power. In another embodiment, the maximum useful pump level is increased by suppressing the catastrophic optical mirror damage. In still another embodiment, the maximum useful pump level is increased by suppressing the pump-induced lasing on a quantum dot excited-state optical transition.

Thermal rollover of the output power can be suppressed by several methods known in the art and is preferably suppressed by a combination of these methods. First, thermal rollover is suppressed if the power conversion efficiency of the laser increases, i.e. if more input power (either optical or electrical) is converted into the output power. Those skilled in the art may appreciate certain known methods for increasing the power conversion efficiency, e.g. decreasing the laser's threshold, increasing the differential quantum efficiency, or decreasing the series resistance of the laser diode.

Second, the thermal rollover behavior can be set aside and, therefore, the maximum useful pump level can be increased if the active region is properly temperature stabilized. To this end, the laser is properly mounted on a heatsink. Preferably the heatsink location is maximally close to the laser's active region. In the case of a diode laser grown on an n-type substrate, such a mounting scheme is known as a "p-side down" mounting. For example, an acceptable temperature level of the heatsink can be stabilized using a thermoelectric Peltier cooler.

Third, the chances of thermal rollover are significantly reduced if the device characteristics of the active region (first of all, the threshold and differential quantum efficiency) are weakly dependent on temperature. In this situation, a temperature increase in the laser's active region has a marginal effect on the laser output. In this context, a quantum dot laser is capable of providing a significant improvement of temperature stability. For example, complete temperature-insensitive behavior of the threshold current density in a quantum dot diode laser was recently demonstrated over a temperature range of 5-75° C. by properly optimized p-type doping of the active region (S. Fathpour, et al., The role of Auger recombination in the temperature-dependent output characteristics ($T_0=\infty$) of p-doped 1.3 µm quantum dot lasers, *Appl. Phys. Lett.* 85(22), November 2004, pp. 5164-5166). In another example, U.S. Pat. No. 6,870,178 shows a method of reducing temperature sensitivity of a quantum dot laser by employing resonant tunnel-injection of the carriers into the quantum dots from a pair of quantum wells.

Catastrophic optical mirror damage of an output mirror of the laser is suppressed by several methods known in the art and is preferably suppressed by a combination of these methods. First, the absolute optical power, which results in damage, can be increased and therefore the maximum useful pump level can be increased, if the output laser's facet is properly protected against water vapor, oxygen and other reagents by dielectric coating and other passivation methods known to those skilled in the art. Second, the active region is preferably fabricated from such materials which are characterized by high resistivity to optical damage. For example, among arsenide-based semiconductor compounds, the damage level increases from AlGaAs to GaAs and from GaAs to InGaAs. In this example, InGaAs is preferably used and AlGaAs is preferably avoided for fabricating the active region. In this context, self-organized quantum dots, which are typically made of InAs or InGaAs, should provide high robustness to the optical damage. Third, the absolute optical power, which results in damage, can be increased, and therefore the maximum useful pump level can be increased if the effective optical mode size is increased. This results in a decrease of the optical power density and is achieved by known methods of mode profile design, e.g. by using sufficiently wide waveguiding layers and/or low optical contrast between waveguiding and cladding layers.

The excitation of the excited-state lasing in the quantum dot laser of the present invention is preferably suppressed. In one embodiment, a spectrally-selective loss is introduced to the laser resonator in order to suppress lasing on a quantum dot excited-state optical transition. Therefore, the maximum useful pump level of the quantum dot laser increases further compared to a laser without the spectrally-selective loss. In one embodiment, the spectrally-selective loss is introduced by spectrally-selective reflection of at least one mirror of the laser. One mirror preferably represents a semiconductor or dielectric distributed Bragg reflector (DBR). The reflection spectrum of the DBR mirror is preferably designed such that the DBR provides a sufficiently high reflectivity for the wavelengths of the ground-state optical transition and simultaneously provides a sufficiently low reflectivity for the wavelengths of the first excited-state optical transition.

In another embodiment, spectrally selective loss is achieved by introducing a spectrally selective absorber to the laser's resonator. The spectrally selective absorber may represent a quantum well or an array of quantum dots with the ground-state optical transition energy which approximately coincides with the optical transition energy of the first excited-state optical transition of the quantum dots in the active region. Therefore, the absorber is nearly transparent for longer-wavelength radiation, e.g., the ground-state optical transition of the active region. At the same time, the absorber effectively absorbs shorter-wavelength radiation, e.g. the excited-state optical transition of the active region.

Control of the Total Number of Quantum Dots in the Laser Active Region

As previously defined, the total number of quantum dots in the active region is a product of the active region area and the effective surface density of quantum dots (an in-plane surface density of quantum dots multiplied by the number of quantum dot planes in the laser's active region). The total number of quantum dots in the active region may affect many of the characteristics of the laser, which in turn may result in a variation of the spectral power density and the bandwidth. Accordingly, the laser of the present invention controls the total number of quantum dots in the laser active region, such that the spectral power density and the bandwidth are preferably simultaneously optimized.

FIGS. 6a through 6c show a correlation between the spectral bandwidth and the spectral power density in a quantum dot laser with a variable number of quantum dots in the active region, where the number of quantum dots is adjusted by varying the effective surface density of quantum dots in various ways.

The effect of the effective surface density of quantum dots on the characteristics of the laser is illustrated in FIG. 6a, in which the spectral power density, $\rho$, is shown as a function of the bandwidth, $\Delta$. Different points of the $\rho$-$\Delta$ curve correspond to different effective surface densities ($n_{QD}$) of quantum dots where the density decreases from the left-hand end of the curve to the right-hand end. A hatched region represents the field of the characteristics of the laser which satisfy the desirable specification ($\Delta \geqq 15$ nm, $\rho \geqq 10$ mW/nm).

As the effective surface density of quantum dots decreases for a constant pump level, the bandwidth of the emission spectrum increases because of the reduced density of states in the active region. At the same time, the output power of the quantum dot laser remains nearly constant because the laser's threshold and the differential quantum efficiency are insignificantly varied with the dot density at a certain interval of the density. Therefore, the spectral power density decreases as the effective surface density of quantum dots decreases. As a result, the $\rho$-$\Delta$ dependence represents a decreasing curve, as illustrated in FIG. 6a.

On one hand, at relatively high quantum dot densities (e.g. $4.6 \times 10^{11}$ cm$^{-2}$), the spectral power density is quite high (e.g. about 20 mW/nm). However, the spectral bandwidth is relatively small (e.g. about 10 nm). On the other hand, at relatively low quantum dot densities (e.g. $2.7 \times 10^{11}$ cm$^{-2}$), the spectral bandwidth is quite high (e.g. about 25 nm). However, the spectral power density is insufficient (e.g. about 8 mW/nm). According to data presented in FIG. 6a, if the effective surface density of quantum dots is properly optimized (preferably between $2.9$–$3.7 \times 10^{11}$ cm$^{-2}$), provided that the other parameters of the quantum dot active region and the laser design are also properly optimized, then the bandwidth of the emission spectrum exceeds 15 nm while the spectral power density simultaneously exceeds 10 mW/nm.

In another embodiment, the bandwidth is sufficiently high so that $\rho$ may be less than 10 mw/nm, while a high optical power is still achieved (provided that the other parameters of the quantum dot active region and the laser design are also properly optimized). In FIG. 6a, this is illustrated by the quantum dot densities between $2.7 \times 10^{11}$ cm$^{-2}$ and $2.9 \times 10^{11}$ cm$^{-2}$.

The effect of the active region area, which is a product of the laser width and length, is considered in a similar way. The effect of the width (W) of the laser on its characteristics is illustrated in FIG. 6b, in which the spectral power density, $\rho$, is shown as a function of the bandwidth, $\Delta$. Different points of the $\rho$-$\Delta$ curve correspond to different widths in which the width decreases from the left-hand end of the curve to the right-hand end. A hatched region represents the field of the laser's characteristics which satisfy the desirable specification ($\Delta \geqq 15$ nm, $\rho \geqq 10$ mW/nm).

As the laser's width decreases for a constant pump level, the bandwidth of the emission spectrum increases because of the reduced number of quantum dots in the active region. At the same time, the output power of a quantum dot laser remains nearly constant as the laser's width changes at a certain interval, because the differential quantum efficiency is nearly unchanged and the laser's threshold is preferably much lower than the pump level. Therefore, the spectral power density decreases as the laser's width decreases. As a result, the $\rho$-$\Delta$ dependence represents a decreasing curve, as illustrated in FIG. 6b.

On the one hand, in relatively wide lasers (e.g. 7.3 µm), the spectral power density can be quite high (e.g. about 20 mW/nm). However, the spectral bandwidth is relatively small (e.g. about 10 nm). On the other hand, for relatively narrow lasers (e.g. 3.3 µm) the spectral bandwidth can be quite high (e.g. about 25 nm). However, the spectral power density is insufficient (e.g. about 8 mW/nm). According to data presented in FIG. 6b, if the width of the laser is properly optimized (preferably between 3.8-5.4 µm), the bandwidth of the emission spectrum exceeds 15 nm while the spectral power density simultaneously exceeds 10 mW/nm, provided that the other parameters of the quantum dot active region and the laser design are also properly optimized.

In another embodiment, the bandwidth is sufficiently high so that $\rho$ may be less than 10 mw/nm, while a high optical power is still achieved (provided that the other parameters of the quantum dot active region and the laser design are also properly optimized). In FIG. 6b, this is illustrated with widths between 3.3 and 3.8 µm.

The effect of the length of the laser on its characteristics is illustrated in FIG. 6c, in which the spectral power density, $\rho$, is shown as a function of the bandwidth, $\Delta$. Different points of the $\rho$-$\Delta$ curve correspond to different lengths (L) where the length decreases from the left-hand end of the curve to the right-hand end. A hatched region represents the field of the characteristics of the laser which satisfy the preferred specification ($\Delta \geqq 15$ nm, $\rho \geqq 10$ mW/nm).

As the length of the laser decreases for a constant pump level, the bandwidth of the emission spectrum sharply increases because of the reduced number of quantum dots in the active region, whose effect is enhanced by increasing the optical loss. At the same time, the output power of the quantum dot laser also increases as the length of the laser decreases in a certain interval because of the increase in the differential quantum efficiency and the decrease in the laser's threshold. However, the spectral bandwidth increases much faster than the output power does. Therefore, the spectral power density decreases as the length decreases. As a result, the ρ-Δ dependence represents a decreasing curve, as illustrated in FIG. 6c.

On one hand, in relatively long lasers (e.g. 1.46 mm), the spectral power density can be quite high (e.g. about 20 mW/nm). However, the spectral bandwidth is relatively small (e.g. about 10 nm). On the other hand, in relatively short lasers (e.g. 0.75 mm), the spectral bandwidth can be quite high (e.g. about 25 nm). However, the spectral power density is insufficient (e.g. less than 9 mW/nm). According to data presented in FIG. 6c, if the length is properly optimized (preferably between 0.83-1.06 mm), the bandwidth of the laser's emission spectrum exceeds 15 nm, while the spectral power density simultaneously exceeds 10 mW/nm, provided that the other parameters of the quantum dot active region and the laser design are also properly optimized.

In another embodiment, the bandwidth is sufficiently high so that ρ may be less than 10 mw/nm, while a high optical power is still achieved (provided that the other parameters of the quantum dot active region and the laser design are also properly optimized). In FIG. 6c, this is illustrated with lengths between 0.75 and 0.83 mm.

Therefore, if the total number of quantum dots in the active region is properly controlled by proper control of the effective surface density of the quantum dots and the area of the active region, then the bandwidth of the emission spectrum exceeds 15 nm and the spectral power density simultaneously exceeds 10 mW/nm, provided that the other parameters of the quantum dot active region and the laser design are also properly optimized.

The effective surface density of quantum dots in the array may be varied either by making the in-plane distribution of quantum dots more or less dense (i.e. controlling the in-plane surface density of quantum dots in each plane), or by stacking several planes of quantum dots (i.e. controlling the number of quantum dot planes successively formed in the matrix). Accordingly, in the quantum dot laser of the present invention, the total number of quantum dots in the active region is controlled by one or more methods including, but not limited to: the control of the number of quantum dot planes successively formed in the matrix, the control of the in-plane surface density of quantum dots, and the control of the area of the active region.

The number of stacked planes of quantum dots may be widely varied using existing methods of quantum dot formation. For example, self-organized In(Ga)As quantum dots in a GaAs matrix can be successively repeated at least 10 times. Certain precautions, known to those skilled in the art, should be undertaken in order to prevent degradation of the structural and optical quality of the active region in the multiple-stacked quantum dot active region. For example, the thickness of spacers, i.e. matrix layers deposited in between neighboring quantum dot planes, must be sufficiently thick. The optimum thickness of the spacers usually increases as the number of quantum dot planes increases.

All quantum dot planes in the quantum dot laser of the present invention are preferably formed by the same fabrication method and under the same fabrication conditions. The Stranski-Krastanow method, a growing method that uses the change in the growth mode from two-dimensional growth to three-dimensional growth when growing a strained semiconductor layer, is preferably used for quantum dot formation. In this case, the identity of fabrication conditions for all quantum dot planes include, but are not limited to, the same growth temperature, atomic fluxes, chemical composition and effective thickness of the deposited materials.

The in-plane surface density of quantum dots in each plane can be controlled by methods known to those skilled in the art. For example, the surface density of self-organized quantum dots can be controlled in certain frames using a sensitivity of quantum dot growth to such epitaxial growth parameters as the temperature of deposition, growth rate, arsenic flux and some others. For example, the surface density of InAs quantum dots deposited in a GaAs matrix by molecular beam epitaxy decreases if the temperature increases. In addition, the surface density of quantum dots is known to be controlled by changing the surrounding matrix material. For example, the deposition of InAlAs quantum dots prior to deposition of InGaAs quantum dots, such that the separation is sufficiently narrow (e.g. 1-3 nm), results in a significant (3-4 times) increase in the surface density of InGaAs quantum dots in comparison with their deposition on a bare GaAs matrix. Also, the surface density of InAs quantum dots can be changed to some extent by changing the In mole fraction in the underlying InGaAs layer.

By using one or a combination of methods that affect the in-plane surface density of quantum dots, it is possible to smoothly change the effective surface density of quantum dots in the active region. However, it is very difficult to change the in-plane surface density in a wide range by prior art methods of quantum dot formation. In contrast, by stacking several planes of quantum dots, it is possible to change, in a wide range, the effective surface density of quantum dots in the active region. However, using this method the effective surface density of quantum dots can only be changed in a step-like manner. Each time the number of planes changes by a unit, the effective density of quantum dots changes by the same increment. In order to vary the effective surface density of quantum dots smoothly and over a wide range, it is preferred to combine both approaches: controlling the number of quantum dot planes successively formed in the matrix and controlling the in-plane surface density of quantum dots.

The area of the active region can be controlled in a wide range by prior art methods. In a laser having a stripe geometry, the area of the active region can be controlled by changing either the laser length, the laser width, or both. For example, the length may be controlled quite precisely by, for example, laser stripe chipping (cleavage) along certain crystallographic atomic planes. The stripe width may be finely controlled by a combination of lithographic methods and by post-growth etching of the laser structure. In addition, the area of the laser's active region may be precisely controlled by selective oxidation of the AlGaAs aperture layer which has a high Al mole fraction.

Because the control of the area of the laser and the control of the effective surface density of quantum dots supplement each other, other desirable device characteristics of the quantum dot laser can be taken into account. For example, the laser length can be chosen such that the direct modulation of the laser output is optimized. Also, the laser width can be chosen such that the single-spatial-mode operation is ensured. A certain variation of the area of the laser, which otherwise would result in a variation of the total number of quantum dots in the active region out of its optimum value, can be compensated for by controlling the variation of the effective surface density of quantum dots.

Figure 7:
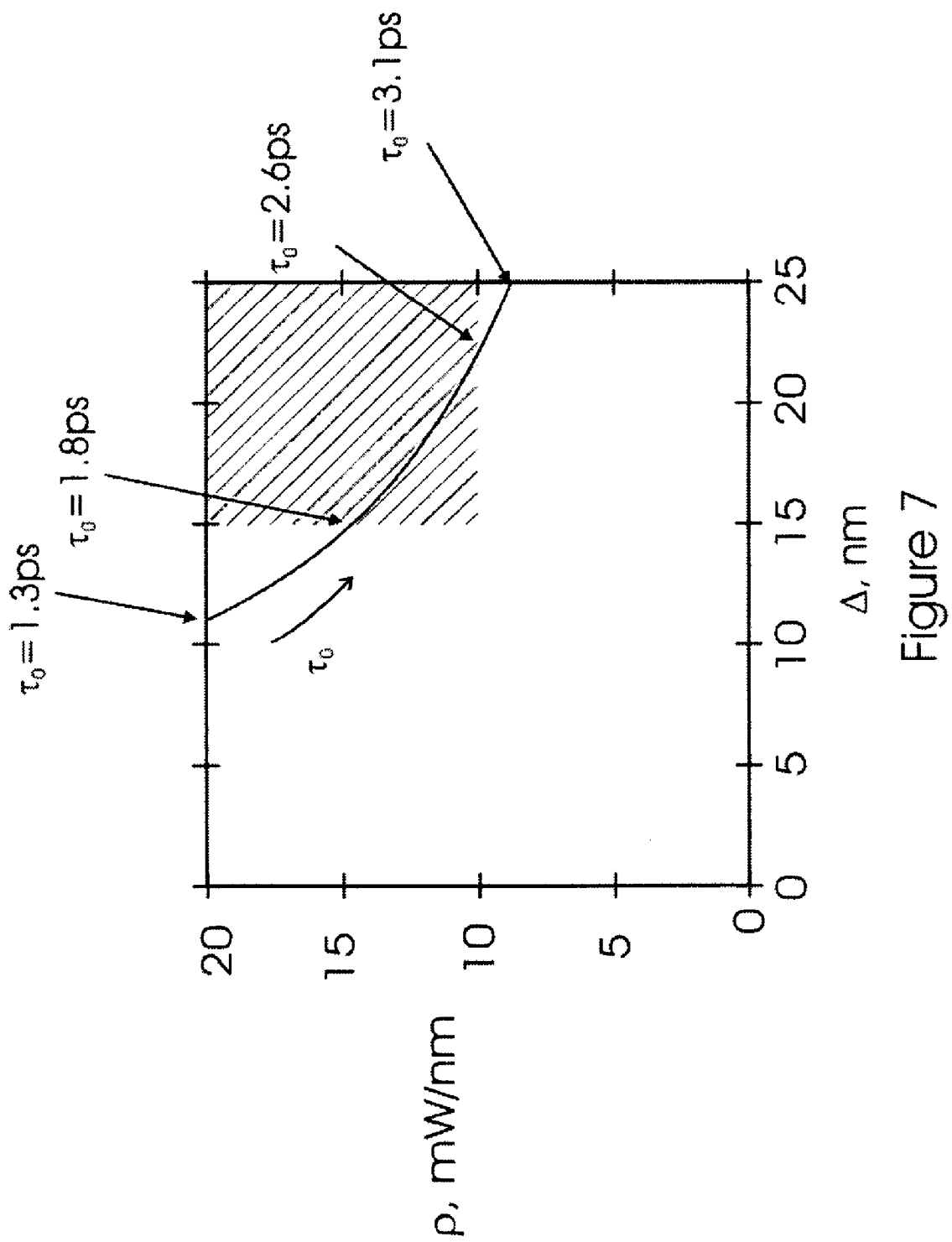
FIG. 7 shows a correlation between the spectral bandwidth and the spectral power density in a quantum dot laser with a variable time of carrier relaxation to the quantum dot ground state level.

Control of Carrier Relaxation to and Excitation from the Quantum Dot Ground States The effect of the carrier relaxation time ($\tau_0$) to the quantum dot ground states on the laser's characteristics is illustrated in FIG. 7, in which the spectral power density, ρ, is shown as a function of the bandwidth, Δ. Different points of the ρ-Δ curve correspond to different times of carrier relaxation in which the time increases from the left-hand end of the curve to the right-hand end. A hatched region represents the field of the characteristics of the laser which satisfy the preferred specification ($\Delta \geq 15$ nm, $\rho \geq 10$ mW/nm).

As the relaxation time increases for a constant pump level, the bandwidth of the emission spectrum increases because the refilling of quantum dot states that contribute to lasing is slowed down. At the same time, the output power of a quantum dot laser remains nearly constant because the laser's threshold and the differential quantum efficiency are nearly constant as the relaxation time changes in a certain interval. Therefore, the spectral power density decreases with an increase in the relaxation time. As a result, the $\rho$-$\Delta$ dependence represents a decreasing curve, as illustrated in FIG. 7.

On one hand, at relatively fast carrier relaxation to the ground state (e.g. 1.3 ps), the spectral power density can be quite high (e.g. about 20 mW/nm). However, the spectral bandwidth is relatively small (e.g. about 10 nm). On the other hand, at relatively slow carrier relaxation (e.g. 3.1 ps), the spectral bandwidth can be quite high (e.g. about 25 nm). However, the spectral power density is insufficient (e.g. about 8 mW/nm). According to data presented in FIG. 7, the relaxation time is preferably optimized in an interval between 1.8-2.6 ps. In this case, provided that the other parameters of the quantum dot active region and the laser design are also properly optimized, the bandwidth of the emission spectrum exceeds 15 nm while the spectral power density simultaneously exceeds 10 mW/mn.

The carrier relaxation, or in other words the refilling process of quantum dot ground states, is usually a multistage process. For example, charge carriers, which are injected into the active area by current injection or photo-generated in the active area by absorbing a pump illumination, should be transported from the place of their injection or generation to the quantum dots. Then, charge carriers are typically captured in the wetting layer of the quantum well layer which typically surrounds the quantum dot plane. The charge carriers typically relax to the higher-energy excited state, then to the lower-energy excited state and finally to the ground state. Therefore, the overall rate of this multi-stage relaxation process is controlled by controlling the rate of certain stages of the process.

Figure 8B:
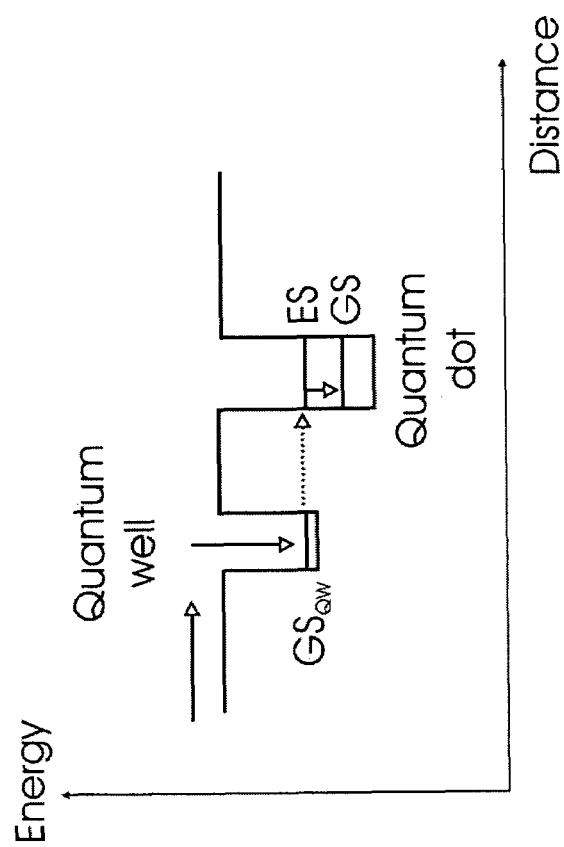
FIG. 8b illustrates how a quantum well can hamper or enhance carrier relaxation to the quantum dot ground-state level.
Figure 8A:
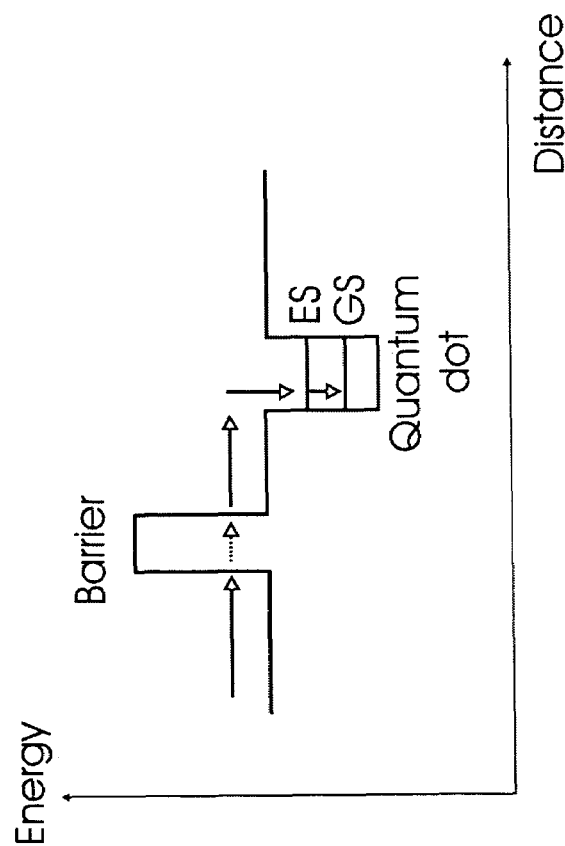
FIG. 8a illustrates how an energy barrier can hamper or enhance carrier relaxation to the quantum dot ground-state level.

An example of a quantum dot laser further including energy barriers located in the matrix in close proximity to the quantum dot active region, is illustrated in FIG. 8a. In FIG. 8a, horizontal arrows represent the charge carriers' movement, and the vertical arrows represent the energy relaxation processes. The energy barriers may hamper the transport of at least one type of charge carrier to the quantum dots due to the quantum tunneling effect. Charge carriers tunneling through the barrier are indicated by the dotted arrow. The tunneling probability decreases as the barrier width and barrier height increase. Therefore, the refilling of the quantum dot ground state by at least one type of charge carrier can be controlled by the width and height of these energy barriers.

In another example, U.S. Pat. No. 6,870,178 discloses a quantum dot laser which employs a resonant tunnel-injection of carriers into the quantum dots from a pair of quantum wells. The quantum dot laser of the present invention may include a quantum well located in the matrix in close proximity to the quantum dot active region, as illustrated in FIG. 8b. Because the density of states of the quantum well is typically much higher than the density of states of the quantum dot array, the carriers are readily captured to the ground-state level of the quantum well ($GS_{QW}$). If the ground-state level of the quantum well ($GS_{QW}$) is higher in energy than the ground-state level of the quantum dots (GS), the carriers then relax to the quantum dot ground-state level (GS) by means of the quantum tunneling effect. Energy separation between the quantum dot excited-state level (ES) and the quantum well level ($GS_{QW}$) can control the relaxation rate. The relaxation is the most efficient (the relaxation time is the shortest) if the quantum well ground-state level ($GS_{QW}$) is in resonance with the quantum dot excited-state level (shown by the dotted arrow in FIG. 8b). Otherwise the relaxation becomes less efficient. The "resonant" quantum well may enhance the refilling rate of the quantum dot ground-state level (GS) compared to a device without the quantum well.

Figure 9:
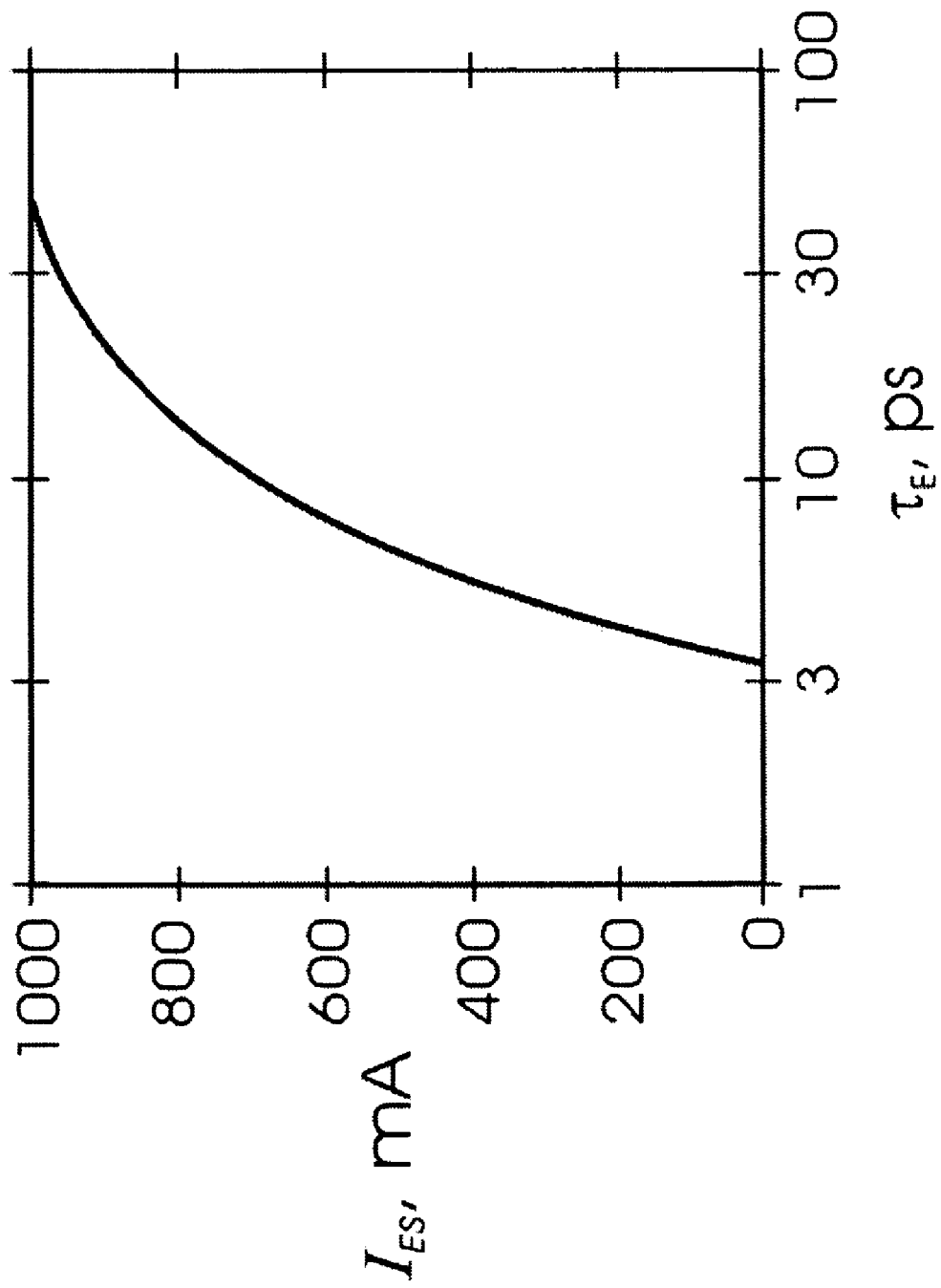
FIG. 9 shows a correlation between the threshold of the excited-state lasing and the carrier excitation time.

The effect of carrier excitation from the quantum dot ground states is closely associated with the effect of pump-induced excited-state lasing in a quantum dot laser. As the carrier excitation from quantum dot states becomes faster (excitation time decreases), more carriers are accumulated in the quantum dot excited-state level at the expense of quantum dot ground-state level. As a result, the optical gain of the excited-state optical transition can overcome the optical gain of the quantum dot ground-state optical transition. Therefore, fast carrier excitation out of quantum dot ground states promotes the pump-induced excited-state lasing. FIG. 9 shows the correlation between the threshold of the excited-state lasing and the carrier excitation time ($\tau_E$). As the excitation time decreases, the threshold of excited-state lasing goes down. Therefore, the maximum useful pump level also decreases in order to avoid the excited-state lasing. Because of the lowered pump level, laser parameters, such as spectral power density and the spectral bandwidth, are unable to reach their desirable values.

In contrast, relatively slow carrier excitation from the quantum dot ground-state level is favorable to ground-state lasing up to high values of pump level. Therefore, if the carrier excitation time is sufficiently high (e.g. >4.8 ps) and other parameters of the active region and the laser itself are in their optimal ranges, the broadband ($\geq 15$ nm) spectrum of the emission and high spectral power density ($\geq 10$ mW/nm) are simultaneously achieved.

Carrier excitation out of a quantum dot is a phonon-assisted process in which the energy of one or several phonons is converted into the carrier's energy. Therefore, the excitation rate from the quantum dot ground state is primarily governed by the ratio of the ground-state localization energy to the thermal energy. The ground-state localization energy is an energy separation between the quantum dot ground-state level and the energy level to which carriers are excited (typically a surrounding quantum well or matrix). The thermal energy is a product of absolute temperature and Boltzmann's constant. A rise in temperature results in more efficient carrier excitation (excitation time decreases), while a rise of ground-state localization energy suppresses carrier excitation (excitation time increases).

In quantum dot structures, carrier excitation can be effectively suppressed because the ground-state localization energy is sufficiently high. For example, in InAs/InGaAs quantum dots emitting around 1.3 μm energy, the separation between the ground state optical transition (0.95 eV) and the GaAs matrix bandgap (1.42 eV) is as high as 0.47 eV. Although this energy separation should be divided between electrons and holes, the ground-state localization energy for carriers of both types is much higher than the thermal energy at typical device operating temperatures (25-30 meV). Therefore, the carrier excitation time can be sufficiently high for carriers of both types, while other parameters of the active region and the laser itself are in their optimal ranges.

Preferred Embodiment

Figures 10A, 10B:
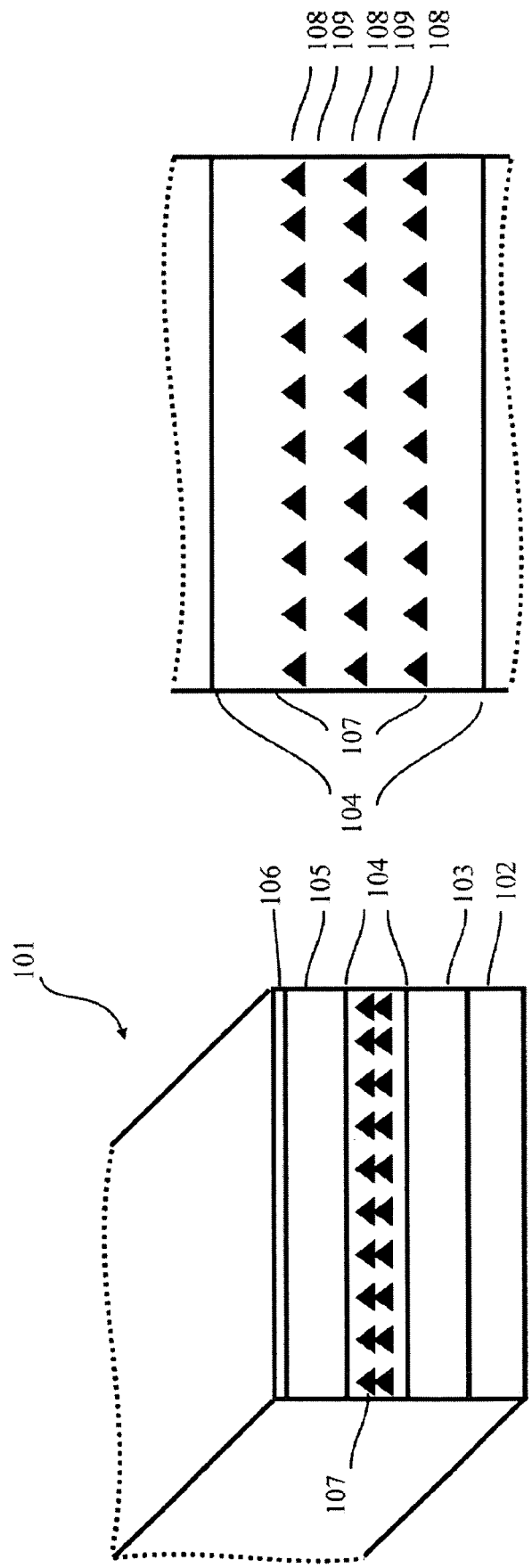
FIG. 10a shows a laser in an embodiment of the present invention.
FIG. 10b shows an active region of the laser of FIG. 10a in more detail.

FIG. 10a shows a layered structure 101 of a quantum dot laser, preferably grown on an n+ doped substrate 102, including layers in the following order: a n-doped first cladding layer 103, a waveguiding layer 104, a p-doped second cladding layer 105, and a p+ contact layer 106, in one embodiment of the present invention. In one example, the layers are preferably an n+ doped GaAs substrate 102, an n-AlGaAs first cladding layer 103, a GaAs waveguiding layer 104, a p-AlGaAs second cladding layer 105, and a p+ GaAs contact layer 106, respectively. The waveguiding layer 104 also plays the role of a matrix in which the active layer 107 is embedded. As illustrated in FIG. 10b, the active layer 107 is preferably formed by the successive deposition of several planes 108 of quantum dots separated by spacer layers 109, which are made of GaAs in this example. Each quantum dot plane preferably represents a plane of Stranski-Krastanow self-organized quantum dots embodied in an InGaAs material system in this example. Each plane is preferably deposited under the same growth conditions.

In one preferred embodiment, a quantum dot laser is grown by molecular beam epitaxy. In a further preferred embodiment, the quantum dot plane is formed by the deposition of approximately 2-3 monolayers of InAs and then covered by approximately 15-20 monolayers of InGaAs with an InAs mole fraction of about 10-30%.

For the quantum dots of the present invention, the ground-state optical transition is preferably around 1.3 µm. This spectral range is useful for optical transmission through a silica fiber or a silicon wafer. In one preferred embodiment, the laser emission spectrum is centered near 1.25-1.32 µm. The quantum dots confine at least one excited-state level for charge carriers. The wavelength of the excited-state optical transition is about 1.2 µm or shorter.

In one preferred embodiment, the in-plane surface density of the quantum dots ranges from $2 \times 10^{10}$ cm$^{-2}$ to $8 \times 10^{10}$ cm$^{-2}$. The number of quantum dot planes preferably ranges from 5 to 10 planes and the spacer thickness is preferably between 20 and 50 nm. In one embodiment, the quantum dot planes are deposited in the GaAs matrix in which AlAs barriers are deposited in the GaAs matrix in a close proximity to the quantum dot active region. In one embodiment, the barrier width is 1-10 monolayers. In one embodiment, AlAs barriers are located in both sides of each quantum dot plane. In one embodiment, quantum dots are p-type doped with Be species at a level of approximately 5 to 20 holes per quantum dot.

The second cladding layer and the contact layer are preferably processed into a ridge structure with side walls protected by a dielectric film. The ridge structure preferably has a width of about 3-10 µm and serves to localize the light generation within a single spatial mode.

An n-ohmic contact is preferably formed on the back side of the substrate and a p-ohmic contact is formed on top of the contact layer. The ohmic contacts are fabricated by methods well-known by those skilled in the art. Metals are selected in accordance with the semiconductor material of the substrate and the contact layer. AuGe/Au (or AuGe/Ni/Au) and AuZn/Au (or Ti/Pt/Au, or Cr/Au) are preferably used in the GaAs-based laser structure for the n- and p-ohmic contacts, respectively.

The laser's optical resonator is preferably defined by cleaved facets, which are optionally coated with high reflective or low reflective dielectric structures. The facet reflectivity is preferably higher than 90% for the first facet and preferably about 5-35% for the second facet. The laser length is preferably 0.3-3 mm.

The fabricated laser is preferably mounted on a copper heatsink, preferably in p-side geometry. The temperature of the heatsink is preferably stabilized at 10-30°C. The laser is preferably forward biased by an electrical source which is capable of supplying at least 300 mA DC current.

The quantum dot laser preferably has a threshold current less than 20 mA, a slope efficiency more than 0.5 W/A, a series resistance less than $5 \times 10^{-4}$ Ohm cm$^{-2}$, a characteristic temperature of the threshold current higher than 100K, and a characteristic temperature of the slope efficiency higher than 300K.

Figure 11A:
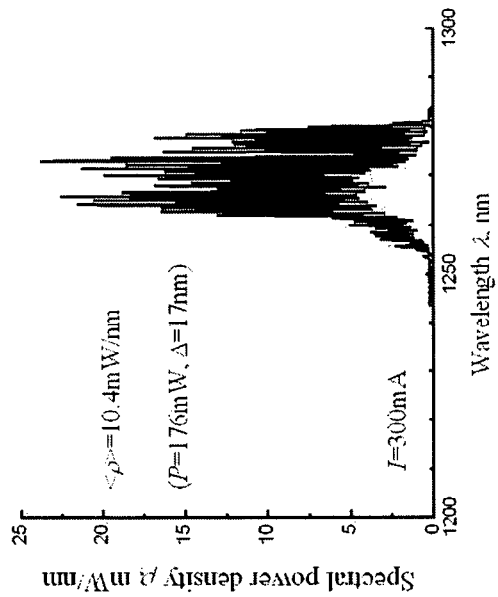
FIG. 11a shows a light-current curve with an increase of the output power of the laser.
Figure 11B:
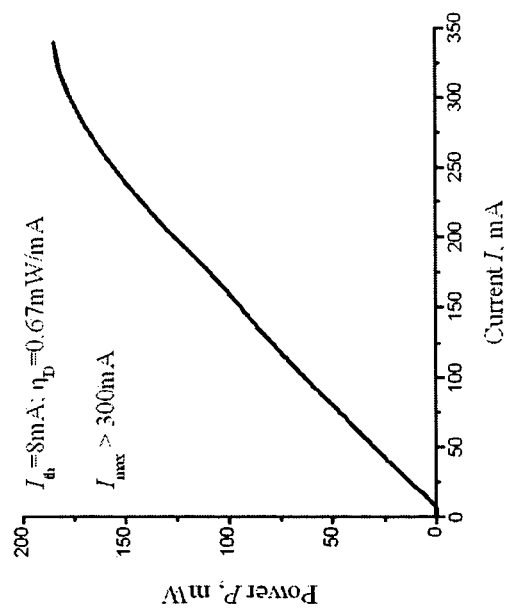
FIG. 11b shows an example of the spectrum of the laser with an increase in the laser output power.
Figure 11C:
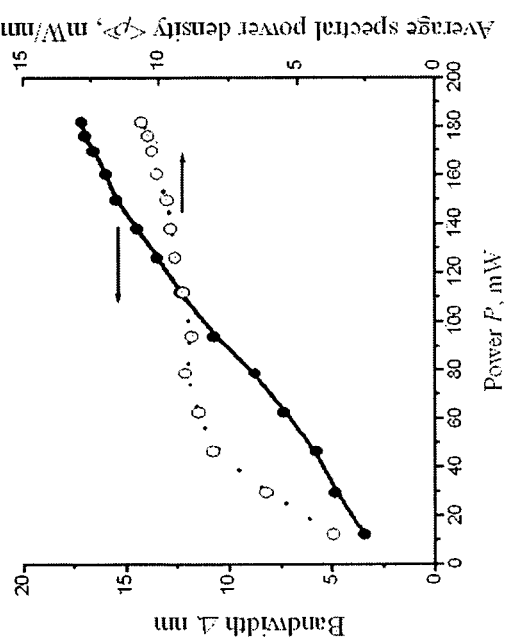
FIG. 11c shows the evolution of the spectral bandwidth and the average spectral power density with an increase in the output power of the laser.

FIG. 11 illustrates some characteristics of a quantum dot diode laser fabricated in accordance with one embodiment of the present invention. FIG. 11a shows a dependence of the laser's output power (P) on drive current (I). The maximum useful pump current exceeds 300 mA. FIG. 11b shows an example of a laser spectrum taken at 300 mA current. The overall spectral bandwidth ($\Delta$) is about 17 nm. The total laser output power (P) is 176 mW, which corresponds to an average spectral power density ($\rho$) >10 mW/nm. No excited-state lasing band is observed in the spectrum. FIG. 11c shows evolution of spectral bandwidth (closed circles) and average spectral power density (open circles) with output power. In a wide range of operation conditions, the spectral bandwidth exceeds 15 nm, and under certain operation conditions the average spectral power density simultaneously reaches 10 mW/nm and slightly more.

Figure 12:
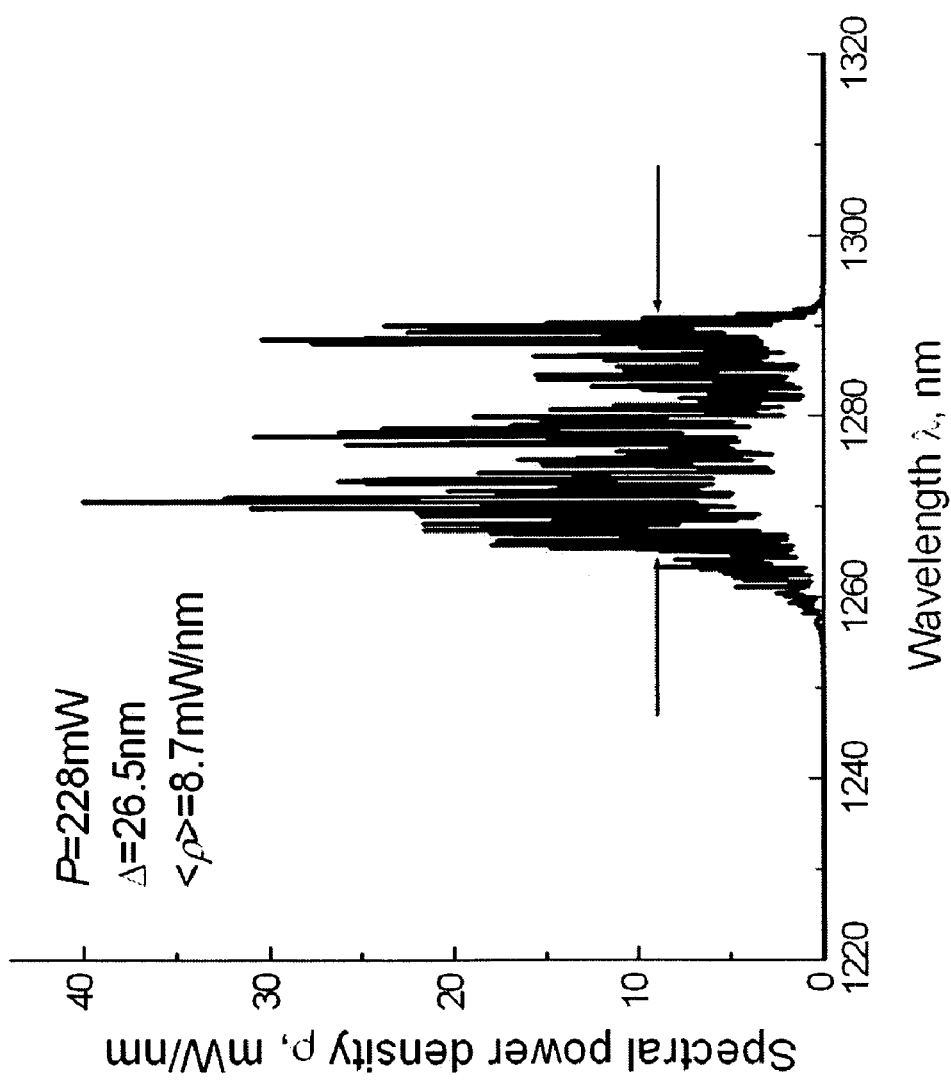
FIG. 12 shows a laser spectrum of a quantum dot diode laser fabricated in accordance with another embodiment of the present invention.

FIG. 12 shows an example of a laser spectrum of a quantum dot diode laser fabricated in accordance with another embodiment of the present invention. The spectrum is taken at 800 mA while the maximum useful pump current exceeds 1000 mA. The overall spectral bandwidth ($\Delta$) is about 26.5 nm. The total laser output power (P) is 228 mW, which corresponds to an average spectral power density ($\rho$) of about 8.7 mW/nm. In this embodiment, the average spectral power density exceeds 7 mW/nm in a wide range of operation conditions, and under certain operation conditions the overall spectral bandwidth reaches 25 nm and slightly more.

Optical Source for a WDM System

An optical source for a WDM system includes a quantum dot laser. In accordance with a method of the present invention, the active region of the laser, the laser design and the laser operating conditions are optimized such that the quantum dot laser is capable of emitting a broadband high-power radiation with an emission spectrum bandwidth of at least 15 nm and an optical power of at least 100 mW. In a preferred embodiment, the optical power is at least 150 mW. In another preferred embodiment, the spectral power density is at least 7 mW/nm and more preferably at least 10 mW/nm.

Quantum dot lasers are capable of operating over a multi-frequency regime, i.e. they emit a number of longitudinal modes. Quantum dot lasers preferably operate in the fundamental spatial mode regime. Therefore the laser output can be coupled with low coupling loss to a single mode optical fiber, a single-mode planar silicon waveguide, or a similar single-mode waveguiding device. In one embodiment, the quantum dot laser is a ridge-waveguide laser. In another embodiment, the quantum dot laser is an oxide-confined laser. In yet another embodiment, the quantum dot laser is a buried waveguide laser. Other lateral designs are possible in order to ensure a single-spatial-mode operation of the quantum dot laser. In one embodiment, the quantum dot laser is an electrically pumped (diode) laser. In another embodiment, the quantum dot laser is an optically pumped laser.

Figure 13B:
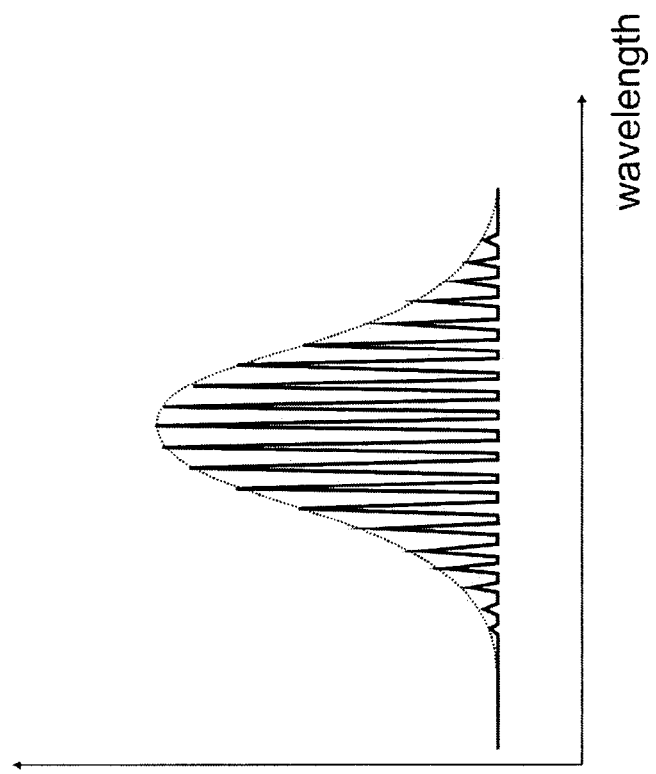
FIG. 13b shows an emission spectrum of a quantum dot laser in which mode grouping is suppressed.
Figure 13A:
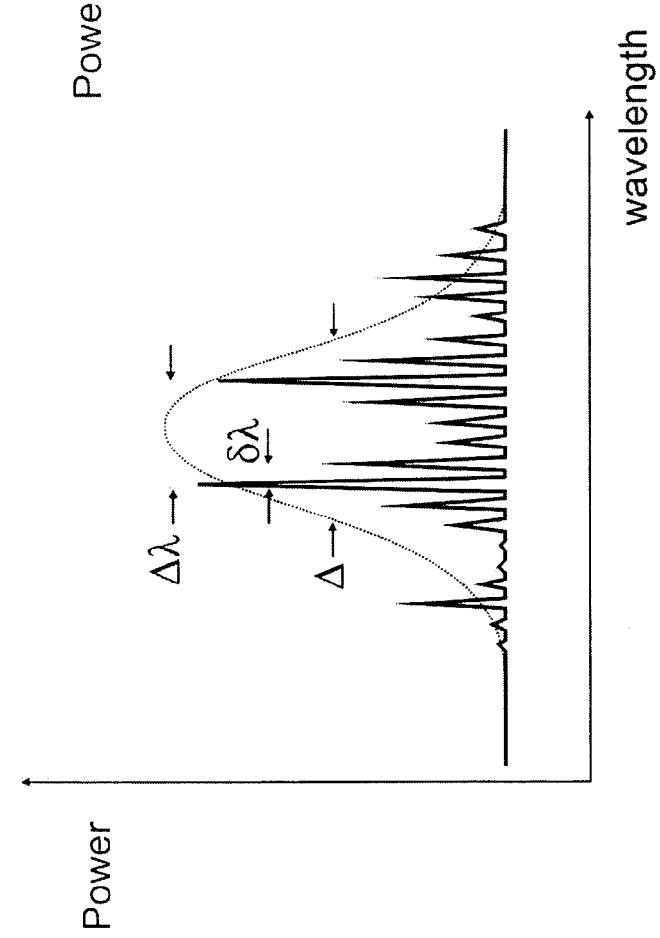
FIG. 13a shows an emission spectrum of a quantum dot laser in the presence of mode grouping.

The emission spectrum of a quantum dot laser often demonstrates mode grouping, i.e. a modulation of intensity of the longitudinal modes with a certain wavelength periodicity. The periodicity of the mode grouping, $\Delta\lambda$, typically exceeds the separation between neighboring longitudinal modes, $\delta\lambda$, being less than the total bandwidth of the emission spectrum, $\Delta$, as illustrated in FIG. 13a. This non-intentional modulation of the spectral power density is not desired for a quantum dot laser operating as an optical source of a WDM system. Therefore, in one preferred embodiment, the quantum dot laser of the present invention includes suppression of mode grouping in the emission spectrum. FIG. 13b shows an emission spectrum of a quantum dot laser in which the mode grouping is suppressed.

The mode grouping of a quantum dot laser originates from a partial reflection at the back side of semiconductor substrate which results in constructive or destructive interference for certain wavelengths. Therefore, in one embodiment, the mode grouping in the emission spectrum of the quantum dot laser is suppressed by roughing the back side surface of the substrate on which the quantum dot laser is grown.

The intensity of the output radiation of the laser may optionally be modulated with a radio frequency in order to provide a required clock rate. In one embodiment, the quantum dot laser is directly modulated. In another embodiment, the quantum dot laser is externally modulated by an electro-absorption modulator or the like. In yet another embodiment, each spectral channel is separately modulated.

In one embodiment, the optical source for a WDM system further includes a spectral splitter. In one embodiment, the spectral splitter is fabricated as an external optical element. In another embodiment, the spectral splitter and the quantum dot laser are hybridly integrated in a single carrier substrate. In one embodiment, the spectral splitter represents an optical prism or a grating. In another embodiment, the spectral splitter represents an arrayed waveguide grating. The optical source for a WDM system optionally includes additional mirrors, fibers, lenses, waveguides, or other standard optical components.

Figure 14B:
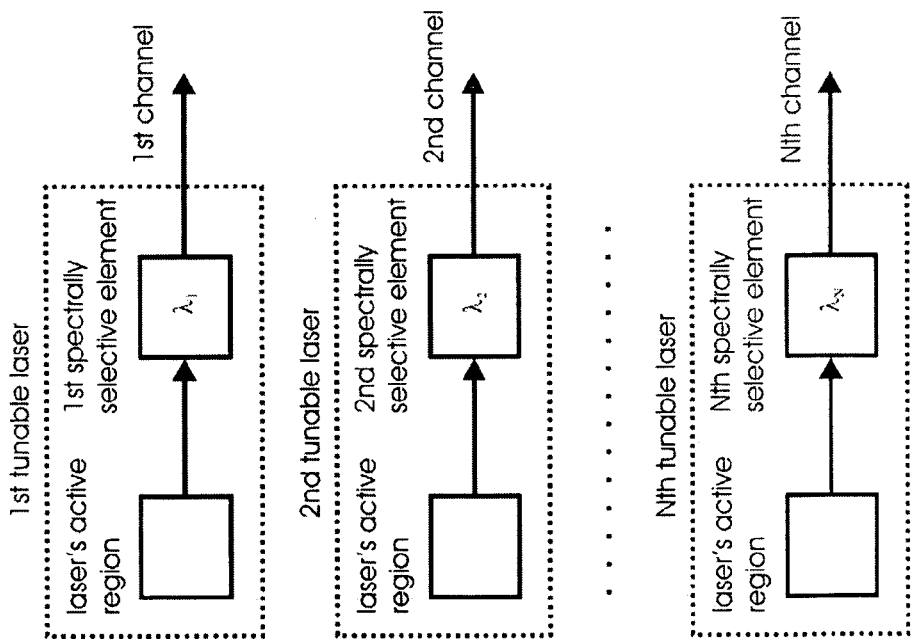
FIG. 14b schematically shows an optical source for a WDM system of the present invention.
Figure 14A:
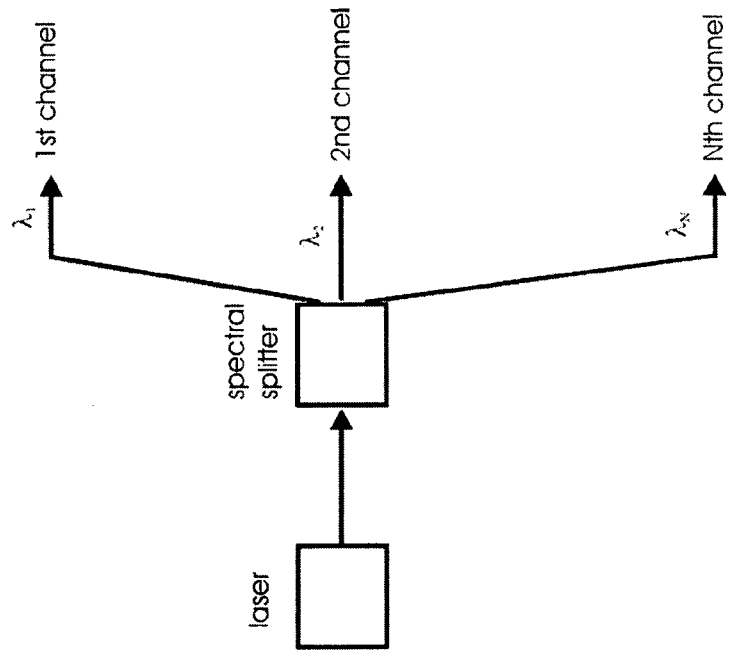
FIG. 14a schematically shows an optical source for a WDM system in accordance with the prior art.

FIG. 14 illustrates, in a block diagram, the optical source for a WDM system based on the use of several tunable lasers in accordance with the prior art (FIG. 14a) and the optical source for WDM system based on the use of single broadband quantum dot lasers in accordance with an embodiment of the present invention (FIG. 14b). The prior art optical source typically includes N tunable lasers and N spectrally selective elements which stabilize the wavelength of a certain tunable laser in accordance with requirements for WDM optical channels. Conversely, the broadband emission spectrum of the quantum dot laser in accordance with the present invention is spectrally split into several independent spectral elements. Therefore, the optical source for an N-channel WDM system may include a single laser and a single spectral splitter. This avoids additional complexity in fabrication and additional expense compared to optical sources of the prior art. High spectral power density, which is achieved in the laser of the present invention, provides sufficient laser power per channel for a laser of the WDM system.

There are additional advantages of an optical source for a WDM system in accordance with the present invention. A light-emitting diode (LED) and a superluminescent light-emitting diode (SLED) are capable of emitting in a broad spectral range. However, these devices are typically characterized by low efficiency compared to a laser device and their output power is typically low. Therefore, a LED or a SLED when used as an optical source for a WDM system provides only limited power per spectral channel of the WDM system. In contrast, the optical source of the present invention is based on a laser device. Because sufficient bandwidth is achieved in the lasing regime of operation, the efficiency is high compared to a light-emitting diode or even a superluminescent light-emitting diode. Therefore, high overall power is readily achieved, and the output power in one spectral channel is also sufficiently high.

It should be understood by those skilled in the art that the embodiments of the invention herein described are merely illustrative of the application of the principles of the invention. More relaxed parameters of the laser output (e.g. a bandwidth less than 15 nm and/or a total optical power less than 150 mW) can readily be achieved by using methods disclosed in the present invention. Reference herein to details of the illustrated embodiments is not intended to limit the scope of the claims, which themselves describe those features regarded as essential to the invention. Reference throughout the text to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification do not necessarily all refer to the same embodiment.

What is claimed is:

1. A laser comprising a semiconductor quantum dot active region comprising a plurality of quantum dots located in a semiconductor matrix;
   wherein the laser operates on an inhomogeneously broadened ground-state optical transition of quantum dots; and
   wherein a spectral bandwidth of an output lasing spectrum of the laser is at least 15 nm and a spectral power density is at least 7 mW/nm.

2. The laser of claim 1, wherein the spectral power density is at least 10 mW/nm.

3. The laser of claim 2, wherein the spectral bandwidth and the spectral power density are controlled by controlling at least one characteristic selected from the group consisting of:
   a maximum useful pump level;
   a total number of quantum dots in an active region of the laser; and
   a carrier relaxation to the quantum dot ground states.

4. The laser of claim 3, wherein the maximum useful pump level is controlled by suppressing thermal rollover of the output power.

5. The laser of claim 4, wherein thermal rollover is suppressed by a method selected from the group consisting of:
   increasing power conversion efficiency of the laser;
   stabilizing a temperature of the active region of the laser; and
   fabricating the active region with a temperature-insensitive threshold and differential efficiency.

6. The laser of claim 3, wherein the maximum useful pump level is controlled by suppressing catastrophic optical mirror damage.

7. The laser of claim 6, wherein catastrophic optical mirror damage is suppressed by a method selected from the group consisting of:
   protecting a facet of the laser;
   fabricating the active region from materials with a sufficient optical power density to result in damage; and
   increasing effective optical mode size.

8. The laser of claim 3, wherein the maximum useful pump level is controlled by suppressing pump-induced lasing on a quantum dot excited-state optical transition.

9. The laser of claim 8, further comprising a spectrally-selective element that provides a spectrally-selective loss to suppress pump-induced lasing on a quantum dot excited-state optical transition.

10. The laser of claim 3, wherein a total number of quantum dot states is controlled by a method selected from the group consisting of:
controlling a number of quantum dot planes successively formed in the matrix;
controlling an in-plane surface density of quantum dots; and
controlling an area of the active region.

11. The laser of claim 1, wherein the spectral bandwidth and the spectral power density are controlled by controlling at least one characteristic selected from the group consisting of:
a maximum useful pump level;
a total number of quantum dots in an active region of the laser; and
a carrier relaxation to the quantum dot ground states.

12. The laser of claim 11, wherein the maximum useful pump level is controlled by suppressing thermal rollover of the output power.

13. The laser of claim 12, wherein thermal rollover is suppressed by a method selected from the group consisting of:
increasing power conversion efficiency of the laser;
stabilizing a temperature of the active region of the laser; and
fabricating the active region with a temperature-insensitive threshold and differential efficiency.

14. The laser of claim 11, wherein the maximum useful pump level is controlled by suppressing catastrophic optical mirror damage.

15. The laser of claim 14, wherein catastrophic optical mirror damage is suppressed by a method selected from the group consisting of:
protecting a facet of the laser;
fabricating the active region from materials with a sufficient optical power density to result in damage; and
increasing effective optical mode size.

16. The laser of claim 11, wherein the maximum useful pump level is controlled by suppressing pump-induced lasing on a quantum dot excited-state optical transition.

17. The laser of claim 16, further comprising a spectrally-selective element that provides a spectrally-selective loss to suppress pump-induced lasing on a quantum dot excited-state optical transition.

18. The laser of claim 11, wherein a total number of quantum dot states is controlled by a method selected from the group consisting of:
controlling a number of quantum dot planes successively formed in the matrix;
controlling an in-plane surface density of quantum dots; and
controlling an area of the active region.

19. The laser of claim 1, further comprising a plurality of energy barriers located in a matrix in close proximity to the quantum dot active region to increase carrier relaxation time in the active region by hampering transport of at least one type of charge carrier to the quantum dots due to a quantum tunneling effect through the energy barriers.

20. The laser of claim 1, further comprising a quantum well located in a matrix in close proximity to the quantum dot active region wherein relaxation of at least one type of charge carrier is controlled by an energy separation between the quantum dot levels and the quantum well levels.

21. The laser of claim 1, wherein excitation of at least one type of charge carrier is controlled by a localization energy of a ground-state energy level with respect to a matrix band edge.

22. The laser of claim 1, further comprising a suppression of mode grouping in an emission spectrum of the laser.

23. The laser of claim 22, wherein suppression occurs by roughing a back side surface of a substrate on which the laser is grown.

24. An optical source for a wavelength division multiplexing system, comprising a laser which comprises a semiconductor quantum dot active region comprising a plurality of quantum dots located in a semiconductor matrix;
wherein the laser operates on an inhomogeneously broadened ground-state optical transition of quantum dots; and
wherein a spectral bandwidth of an output lasing spectrum of the laser is at least 15 nm and a spectral power density is at least 7 mW/nm; and
wherein the laser provides a plurality of optical signals at different wavelengths.

25. The optical source of claim 24, further comprising a spectral splitter fabricated as an external optical element.

26. The optical source of claim 25, wherein the spectral splitter is selected from the group consisting of:
an optical prism;
an optical grating; and
an arrayed waveguide grating.

27. The optical source of claim 24, further comprising a spectral splitter integrated with the laser in a single carrier substrate.

28. The optical source of claim 27, wherein the spectral splitter is selected from the group consisting of:
an optical prism;
an optical grating; and
an arrayed waveguide grating.

29. The optical source of claim 24, wherein an emission spectrum of the laser is spectrally split into at least two independent spectral channels such that the output power in at least one spectral channel is at least 10 mW.

30. The optical source of claim 24, wherein the spectral power density is at least 10 mW/nm.

31. A method of operating a laser with a broadband spectrum comprising the step of:
operating the laser, comprising a semiconductor quantum dot active region comprising a plurality of quantum dots located in a semiconductor matrix, on an inhomogeneously broadened ground-state optical transition of quantum dots;
wherein a spectral bandwidth of an output lasing spectrum of the laser is at least 15 nm and a spectral power density is at least 7 mW/nm.

32. The method of claim 31, further comprising the step of suppressing mode grouping in an emission spectrum of the laser.

33. The method of claim 32, wherein the mode grouping is suppressed by roughing a back side surface of a substrate on which the laser is grown.

34. The method of claim 31, further comprising the step of spectrally splitting an emission spectrum of the laser into at least two independent spectral channels, such that an output power in at least one spectral channel is at least 10 mW.

35. The method of claim 31, further comprising the step of introducing a spectrally-selective loss into a resonator of the laser to suppress lasing on a quantum dot excited-state optical transition.

36. The method of claim 31, wherein the spectral power density is at least 10 mW/nm.

37. A wavelength division multiplexing system, comprising a laser which comprises a semiconductor quantum dot active region comprising a plurality of quantum dots located in a semiconductor matrix;
   wherein the laser operates on an inhomogeneously broadened ground-state optical transition of quantum dots;
   wherein a spectral bandwidth of an output lasing spectrum of the laser is at least 15nm and a spectral power density is at least 7 mW/nm; and
   wherein the laser provides a plurality of optical signals at different wavelengths.

38. The laser of claim 17, wherein the spectrally-selective element comprises at least one spectrally selective absorber layer selected from the group consisting of a quantum well and an array of quantum dots, wherein the ground-state optical transition energy approximately coincides with the optical transition energy of a first excited-state optical transition of the quantum dots in the active region.

39. The laser of claim 1, wherein the laser operates in a continuous wave regime.

* * * * *